US011309197B2

(12) United States Patent
Radauscher et al.

(10) Patent No.: US 11,309,197 B2
(45) Date of Patent: Apr. 19, 2022

(54) MICRO-TRANSFER PRINTING WITH SELECTIVE COMPONENT REMOVAL

(71) Applicant: X Display Company Technology Limited, Dublin (IE)

(72) Inventors: Erich Radauscher, Raleigh, NC (US); Ronald S. Cok, Rochester, NY (US); Christopher Andrew Bower, Raleigh, NC (US); Matthew Alexander Meitl, Durham, NC (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 16/672,399

(22) Filed: Nov. 1, 2019

(65) Prior Publication Data

US 2020/0126825 A1 Apr. 23, 2020

Related U.S. Application Data

(63) Continuation of application No. 16/163,559, filed on Oct. 17, 2018, now Pat. No. 10,573,544.

(51) Int. Cl.
*H01L 21/67* (2006.01)
*H01L 21/68* (2006.01)
(Continued)

(52) U.S. Cl.
CPC .... *H01L 21/67144* (2013.01); *H01L 21/6835* (2013.01); *H01L 22/20* (2013.01);
(Continued)

(58) Field of Classification Search
CPC ............... H01L 21/67144; H01L 22/20; H01L 21/6835; H01L 25/0753;
(Continued)

(56) References Cited

U.S. PATENT DOCUMENTS 6,142,358 A 11/2000 Cohn et al.
6,969,624 B2 11/2005 Iwafuchi et al.
(Continued)

OTHER PUBLICATIONS

Bower, C. A. et al., Micro-Transfer-Printing: Heterogeneous Integration of Microscale Semiconductor Devises using Elastomer Stamps, IEEE Conference, (2014).
(Continued)

*Primary Examiner* — Sheikh Maruf
(74) *Attorney, Agent, or Firm* — Choate, Hall & Stewart LLP; Michael D. Schmitt

(57) ABSTRACT

An example of a method of micro-transfer printing comprises providing a micro-transfer printable component source wafer, providing a stamp comprising a body and spaced-apart posts, and providing a light source for controllably irradiating each of the posts with light through the body. Each of the posts is contacted to a component to adhere the component thereto. The stamp with the adhered components is removed from the component source wafer. The selected posts are irradiated through the body with the light to detach selected components adhered to selected posts from the selected posts, leaving non-selected components adhered to non-selected posts. In some embodiments, using the stamp, the selected components are adhered to a provided destination substrate. In some embodiments, the selected components are discarded. An example micro-transfer printing system comprises a stamp comprising a body and spaced-apart posts and a light source for selectively irradiating each of the posts with light.

26 Claims, 13 Drawing Sheets

(51) Int. Cl.
*H01L 21/66* (2006.01)
*H01L 21/683* (2006.01)
*H01L 25/075* (2006.01)

(52) U.S. Cl.
CPC .................... *H01L 25/0753* (2013.01); *H01L 2221/68322* (2013.01); *H01L 2221/68381* (2013.01)

(58) Field of Classification Search
CPC . H01L 2221/68381; H01L 2221/68322; H01L 2221/68354; H01L 22/22
USPC ........................................................... 438/14
See application file for complete search history.

(56) References Cited

U.S. PATENT DOCUMENTS

| | | | | |
|---|---|---|---|---|
| 7,195,733 | B2 | 3/2007 | Rogers et al. | |
| 7,354,801 | B2 | 4/2008 | Sugiyama et al. | |
| 7,521,292 | B2 | 4/2009 | Rogers et al. | |
| 7,557,367 | B2 | 7/2009 | Rogers et al. | |
| 7,662,545 | B2 | 2/2010 | Nuzzo et al. | |
| 7,704,684 | B2 | 4/2010 | Rogers et al. | |
| 7,799,699 | B2 | 9/2010 | Nuzzo et al. | |
| 7,932,123 | B2 | 4/2011 | Rogers et al. | |
| 7,943,491 | B2 | 5/2011 | Nuzzo et al. | |
| 7,972,875 | B2 | 7/2011 | Rogers et al. | |
| 8,333,860 | B1 | 12/2012 | Bibl et al. | |
| 8,470,701 | B2 | 6/2013 | Rogers et al. | |
| 8,558,243 | B2 | 10/2013 | Bibl et al. | |
| 8,722,458 | B2 | 5/2014 | Rogers et al. | |
| 8,791,474 | B1 | 7/2014 | Bibl et al. | |
| 8,794,501 | B2 | 8/2014 | Bibl et al. | |
| 8,835,940 | B2 | 9/2014 | Hu et al. | |
| 8,865,489 | B2 | 10/2014 | Rogers et al. | |
| 8,877,648 | B2 | 11/2014 | Bower et al. | |
| 8,889,485 | B2 | 11/2014 | Bower | |
| 8,934,259 | B2 | 1/2015 | Bower et al. | |
| 8,941,215 | B2 | 1/2015 | Hu et al. | |
| 8,987,765 | B2 | 3/2015 | Bibl et al. | |
| 9,049,797 | B2 | 6/2015 | Menard et al. | |
| 9,105,714 | B2 | 8/2015 | Hu et al. | |
| 9,111,464 | B2 | 8/2015 | Bibl et al. | |
| 9,139,425 | B2 | 9/2015 | Vestyck | |
| 9,142,468 | B2 | 9/2015 | Bower et al. | |
| 9,153,171 | B2 | 10/2015 | Sakariya et al. | |
| 9,161,448 | B2 | 10/2015 | Menard et al. | |
| 9,165,989 | B2 | 10/2015 | Bower et al. | |
| 9,166,114 | B2 | 10/2015 | Hu et al. | |
| 9,178,123 | B2 | 11/2015 | Sakariya et al. | |
| 9,217,541 | B2 | 12/2015 | Bathurst et al. | |
| 9,240,397 | B2 | 1/2016 | Bibl et al. | |
| 9,252,375 | B2 | 2/2016 | Bibl et al. | |
| 9,355,854 | B2 | 5/2016 | Meitl et al. | |
| 9,358,775 | B2 | 6/2016 | Bower et al. | |
| 9,367,094 | B2 | 6/2016 | Bibl et al. | |
| 9,412,727 | B2 | 8/2016 | Menard et al. | |
| 9,478,583 | B2 | 10/2016 | Hu et al. | |
| 9,484,504 | B2 | 11/2016 | Bibl et al. | |
| 9,520,537 | B2 | 12/2016 | Bower et al. | |
| 9,555,644 | B2 | 1/2017 | Rogers et al. | |
| 9,583,533 | B2 | 2/2017 | Hu et al. | |
| 9,589,944 | B2 | 3/2017 | Higginson et al. | |
| 9,601,356 | B2 | 3/2017 | Bower et al. | |
| 9,640,715 | B2 | 5/2017 | Bower et al. | |
| 9,716,082 | B2 | 7/2017 | Bower et al. | |
| 9,761,754 | B2 | 9/2017 | Bower et al. | |
| 9,765,934 | B2 | 9/2017 | Rogers et al. | |
| 9,865,832 | B2 | 1/2018 | Bibl et al. | |
| 9,923,133 | B2 | 3/2018 | Bower et al. | |
| 9,929,053 | B2 | 3/2018 | Bower et al. | |
| 10,103,069 | B2 | 10/2018 | Bower et al. | |
| 10,153,256 | B2 | 12/2018 | Cok et al. | |
| 10,224,460 | B2 | 3/2019 | Bower et al. | |
| 10,573,544 | B1 | 2/2020 | Radauscher et al. | |
| 10,796,938 | B2 | 10/2020 | Radauscher et al. | |
| 2003/0022403 | A1* | 1/2003 | Shimoda | B82Y 10/00<br>438/14 |
| 2003/0141570 | A1 | 7/2003 | Chen et al. | |
| 2008/0108171 | A1 | 5/2008 | Rogers et al. | |
| 2010/0123268 | A1 | 5/2010 | Menard | |
| 2010/0306993 | A1 | 12/2010 | Mayyas et al. | |
| 2010/0317132 | A1* | 12/2010 | Rogers | H01L 25/0753<br>438/27 |
| 2012/0115262 | A1* | 5/2012 | Menard | H01L 21/6835<br>438/26 |
| 2012/0241919 | A1* | 9/2012 | Mitani | H01L 21/76254<br>257/623 |
| 2012/0273938 | A1 | 11/2012 | Choi et al. | |
| 2012/0313241 | A1* | 12/2012 | Bower | H01L 21/563<br>257/737 |
| 2012/0320581 | A1 | 12/2012 | Rogers et al. | |
| 2013/0036928 | A1* | 2/2013 | Rogers | B41F 16/00<br>101/483 |
| 2013/0037838 | A1* | 2/2013 | Speier | H01L 51/0013<br>257/98 |
| 2013/0140691 | A1 | 6/2013 | Bao et al. | |
| 2013/0153277 | A1 | 6/2013 | Menard et al. | |
| 2013/0300812 | A1* | 11/2013 | Bibl | B25J 15/0052<br>347/159 |
| 2013/0309792 | A1 | 11/2013 | Tischler et al. | |
| 2013/0316487 | A1 | 11/2013 | de Graff et al. | |
| 2013/0333094 | A1* | 12/2013 | Rogers | A61N 1/0476<br>2/161.7 |
| 2014/0008791 | A1 | 1/2014 | Choi et al. | |
| 2014/0038392 | A1* | 2/2014 | Yonehara | B81C 1/0038<br>438/463 |
| 2014/0154821 | A1 | 6/2014 | Chu et al. | |
| 2014/0159043 | A1 | 6/2014 | Sakariya et al. | |
| 2014/0159064 | A1 | 6/2014 | Sakariya et al. | |
| 2014/0252604 | A1 | 9/2014 | Motoyoshi | |
| 2014/0264763 | A1* | 9/2014 | Meitl | H01L 21/02521<br>257/618 |
| 2014/0267683 | A1 | 9/2014 | Bibl et al. | |
| 2014/0367705 | A1 | 12/2014 | Bibl et al. | |
| 2015/0028362 | A1* | 1/2015 | Chan | H01L 27/156<br>257/88 |
| 2015/0371874 | A1 | 12/2015 | Bower et al. | |
| 2015/0372187 | A1* | 12/2015 | Bower | H01L 24/81<br>438/110 |
| 2016/0018094 | A1 | 1/2016 | Bower et al. | |
| 2016/0086855 | A1* | 3/2016 | Bower | H01L 21/7806<br>438/110 |
| 2016/0093600 | A1* | 3/2016 | Bower | H01L 24/82<br>257/89 |
| 2016/0276205 | A1* | 9/2016 | Huska | H01L 33/62 |
| 2017/0025593 | A1* | 1/2017 | Bower | H01L 33/64 |
| 2017/0047306 | A1* | 2/2017 | Meitl | H01L 24/75 |
| 2017/0048976 | A1 | 2/2017 | Prevatte et al. | |
| 2017/0165751 | A1* | 6/2017 | Buller | B22F 10/00 |
| 2017/0186720 | A1* | 6/2017 | Fathi | B32B 37/1284 |
| 2017/0250167 | A1* | 8/2017 | Bower | H01L 21/67144 |
| 2017/0256521 | A1 | 9/2017 | Cok et al. | |
| 2017/0256522 | A1* | 9/2017 | Cok | H01L 27/3255 |
| 2017/0287789 | A1* | 10/2017 | Bower | H01L 25/167 |
| 2017/0338374 | A1* | 11/2017 | Zou | H01L 33/62 |
| 2017/0341143 | A1* | 11/2017 | Abe | B29C 64/35 |
| 2017/0358623 | A1* | 12/2017 | Thothadri | H01L 27/156 |
| 2017/0358717 | A1 | 12/2017 | Cok et al. | |
| 2018/0031974 | A1 | 2/2018 | Prevatte et al. | |
| 2018/0042110 | A1 | 2/2018 | Cok | |
| 2018/0226287 | A1 | 8/2018 | Bower et al. | |
| 2018/0342492 | A1* | 11/2018 | Lu | H01L 33/385 |
| 2018/0374738 | A1* | 12/2018 | Lee | H01L 33/0095 |
| 2019/0393069 | A1* | 12/2019 | Paranjpe | H01L 25/0753 |
| 2020/0144092 | A1 | 5/2020 | Radauscher et al. | |
| 2020/0335380 | A1 | 10/2020 | Radauscher et al. | |

OTHER PUBLICATIONS

Bower, C. A. et al., Transfer Printing: An Approach for Massively Parallel Assembly of Microscale Devices, IEEE, Electronic Components and Technology Conference, (2008).

(56) References Cited

OTHER PUBLICATIONS

Cok, R. S. et al., 60.3: AMOLED Displays Using Transfer-Printed Integrated Circuits, Society for Information Display, 10:902-904, (2010).
Cok, R. S. et al., AMOLED displays with transfer-printed integrated circuits, Journal of SID, 19(4):335-341, (2011).
Cok, R. S. et al., Inorganic light-emitting diode displays using micro-transfer printing, Journal of the SID, 25(10):589-609, (2017).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties?, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructured elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Trindade, A.J. et al., Precision transfer printing of ultra-thin AlInGaN micron-size light-emitting diodes, Crown, pp. 217-218, (2012).
Bower, C. A. et al., Emissive displays with transfer-printed assemblies of 8 μm x 15 μm inorganic light-emitting diodes, Photonics Research, 5(2):A23-A29, (2017).

* cited by examiner

MICRO-TRANSFER PRINTING WITH SELECTIVE COMPONENT REMOVAL

PRIORITY APPLICATION

This application is a continuation of U.S. patent application Ser. No. 16/163,559, filed on Oct. 17, 2018, entitled Micro-Transfer Printing with Selective Component Removal, the disclosure of which is incorporated by reference herein in its entirety.

CROSS REFERENCE TO RELATED APPLICATIONS

This application is related to U.S. Pat. No. 9,358,775, entitled Apparatus and Methods for Micro-Transfer Printing, which is hereby incorporated by reference in its entirety.

TECHNICAL FIELD

The present specification generally relates to systems and methods for micro-transfer printing using a stamp and, in particular, to systems and methods for controllably removing selected components adhered to stamp posts from the stamp.

BACKGROUND

Conventional methods such as pick-and-place for applying integrated circuits to a destination substrate are limited to relatively large devices, for example having a dimension of a millimeter or more and it is often difficult to pick up and place ultra-thin, fragile, or small devices using such conventional technologies. More recently, micro-transfer printing methods have been developed that permit the selection and application of such ultra-thin, fragile, or small devices without causing damage to the devices themselves.

Micro-transfer printing enables deterministically removing arrays of micro-scale, high-performance devices from a native source wafer, typically a semiconductor wafer on which the devices are constructed, and assembling and integrating the devices onto non-native destination substrates, such as glass or polymer substrates. In a simple embodiment, micro-transfer printing is analogous to using a rubber stamp to transfer liquid-based inks from an ink-pad onto paper. However, the "inks" are typically composed of high-performance solid-state semiconductor devices and the "paper" can be substrates, including glass, plastics, ceramics, metals, or other semiconductors, for example. An example micro-transfer printing process leverages engineered elastomer stamps coupled with high-precision motion-controlled print-heads to selectively pick up and print large arrays of micro-scale devices from a source native wafer onto non-native destination substrates.

Adhesion between an elastomer transfer device and a printable element can be selectively tuned by varying the speed of the print-head, for example. This rate-dependent adhesion is a consequence of the viscoelastic nature of the elastomer used to construct the transfer device. When the transfer device is moved quickly away from a bonded interface, the adhesion is large enough to "pick" the printable elements away from their native substrates, and conversely, when the transfer device is moved slowly away from a bonded interface the adhesion is low enough to "let go" or "print" the element onto a foreign surface. This process may be performed as a massively parallel operation in which the stamps can transfer, for example, hundreds to thousands of discrete structures in a single pick-up and print operation.

Micro-structured stamps may be used to pick up micro devices from a source substrate, transport the micro devices to the destination, and print the micro devices onto a destination substrate. A transfer device (e.g., micro-structured stamp) can be created using various materials. Posts on the transfer device can be designed to pick up material from a pick-able object and then print the material to the target substrate. The posts can be formed in an array. For effective, high-yield printing, when picking up the material it is important that the stamp posts are in close contact with the material (e.g., micro integrated circuits) being transferred or printed.

In any printing operation, it is important that the destination (receiving) substrate include functional devices at every desired location on the destination substrate at the end of an assembly process and it is therefore important to provide methods and systems for ensuring completely functional micro-transfer-printed structures.

SUMMARY

The present invention provides, inter alia, systems and methods for transferring micro-devices from a native micro-device source wafer or micro-device source substrate to a non-native destination substrate. According to some embodiments of the present invention, a method of micro-transfer printing comprises providing a component source wafer or micro-device source substrate having micro-transfer printable components disposed on or in the component source wafer or micro-device source substrate. Micro-transfer printable components and micro-transfer printed components can be referred to as components herein. Selected ones of the micro-transfer printable components are selected components and the micro-transfer printable components that are not selected are non-selected components.

In some embodiments, a stamp comprising a body and spaced-apart posts protruding away from the body to a distal end of the posts is provided. The posts have a spatial distribution on the body matched to a spatial distribution of the micro-transfer printable components on or in the component source wafer. The stamp can be a visco-elastic stamp, for example comprising PDMS (polydimethylsiloxane). A provided light source can controllably irradiate each of the posts with light through the body.

Each of the posts is contacted to a component of the micro-transfer printable components to adhere the component to a distal end of the post, for example with van der Waals forces. Posts contacting the selected components are selected posts and posts contacting the non-selected components are non-selected posts. Controllably irradiating with a light source means that each of the posts can be irradiated, or not, by the light source depending on whether the post is a selected post or a non-selected post. Selected posts can be irradiated and non-selected posts can be non-irradiated.

The stamp with the adhered components is removed from the component source wafer and each of the selected posts are irradiated through the body with the light to detach the selected components adhered to the selected posts from the selected posts, leaving the non-selected components adhered to the non-selected posts. The body and the posts are substantially transparent to the light.

Some embodiments of the present invention comprise providing a destination substrate and contacting the non-selected components to the destination substrate using the stamp to adhere the non-selected components to the destination substrate, or to a layer on the destination substrate, after detaching the selected components from the selected posts. The step of providing a destination substrate can comprise providing an adhesive layer on the destination substrate and the step of contacting the non-selected components to the destination substrate can comprise directly contacting the non-selected components to the adhesive layer.

In some embodiments of the present invention, the component source wafer comprises a patterned sacrificial layer defining spaced-apart sacrificial portions and anchors, and the components are each disposed over a sacrificial portion and physically connected to an anchor by a tether (e.g., at least one anchor by at least one tether). The steps of contacting the posts to the components and removing the stamp can fracture or break the tethers or separate the tethers from the components.

Irradiation of selected posts can irradiate a distal end of the selected posts, can irradiate selected components adhered to the distal ends of the selected posts, can irradiate a portion of the selected components adhered to the distal ends of the selected posts, can irradiate a layer of the selected components adhered to the distal ends of the selected posts, or any combination of these. In some embodiments of the present invention, each of the components comprises an ablation layer and the irradiation of the selected posts vaporizes at least a portion of the ablation layer of the selected components, for example a portion in contact with the distal end of the selected post. In some embodiments, the posts and the components (e.g., a portion thereof) have different coefficients of thermal expansion (CTEs). In some embodiments, irradiation of the selected posts can heat the selected posts or the distal ends of the selected posts so that the distal end of the selected posts expands differently from the selected components adhered to the selected posts so that a thermal shear (a shear force due to temperature differences) takes place between the selected components and the distal ends of the selected posts, detaching the selected components adhered to the distal ends of the selected posts from the distal ends of the selected posts. In some embodiments, irradiation of the selected components heats the selected components, a portion of the selected components, or a layer or portion of a layer of the selected components so that the distal end of the selected posts to which the selected components are adhered expands differently from the selected components adhered to the selected posts so that a thermal shear takes place between the selected components and the distal ends of the selected posts, detaching (e.g., assisting in detaching along with stamp 10 motion) the selected components adhered to the distal ends of the selected posts from the distal ends of the selected posts.

In some embodiments of the present invention, each of the components is tested before contacting the posts to the components to determine faulty components. Faulty components are selected so that each of the selected components is a faulty component. In some embodiments of the present invention, components are selected that are not faulty so that each selected component is a non-faulty component. In some embodiments, selected components have at least one characteristic different from a characteristic of non-selected components (e.g., independent of whether any selected or non-selected component is faulty or not). In some embodiments, a mapping of the selected components and the non-selected components is provided.

In some embodiments of the present invention, a disposal area is provided and the stamp is moved to the disposal area before the selected posts are irradiated so that irradiating the selected posts detaches the selected components from the selected posts and disposes the selected components in the disposal area.

Some embodiments of the present invention comprise providing a destination substrate and moving the stamp to the destination substrate before irradiating the selected posts so that irradiating the selected posts detaches the selected components from the selected posts and adheres the selected components to the destination substrate or to a layer on the destination substrate. Non-selected components are not adhered to the destination substrate. In some embodiments, the selected components are in contact with the destination substrate during the irradiation. In some embodiments, the selected components in contact with the destination substrate and the selected posts are removed from the selected components during the irradiation, so that the steps of irradiation and removal of the stamp from the selected components occurs at the same time, occur partially at the same time, or overlap in time. By removing the selected posts from the selected components during the irradiation step (e.g., by removing the stamp), the selected components are prevented from re-adhering to the selected posts after the irradiation is complete. In some embodiments, the selected components are adjacent to but not in contact with the destination substrate so that the selected components are detached from the selected posts and the selected components travel from the selected posts to the destination substrate. In some embodiments where components comprise ablation layers, the selected components can be forcibly ejected from the selected posts and propelled onto the destination substrate. In embodiments relying on a shear force formed between the selected posts and the selected components, for example by heating and a CTE mismatch between the selected posts and the selected components, the selected components can fall from the selected posts to the destination substrate under the force of gravity.

In some embodiments of the present invention, irradiating selected posts comprises irradiating a single post at a time. In some embodiments of the present invention, irradiating selected posts comprises irradiating multiple posts at a time. The light source can be a laser and methods of the present invention can comprise providing an optical system that can controllably direct a laser beam from the laser to one, or more than one, selected post at a time.

In some embodiments of the present invention, each of the posts has a distal end protruding away from the body and the step of contacting each post to a component comprises contacting the distal end of the post to the component to adhere the component to the distal end of the post. Irradiating the selected posts with the light source controllably irradiates the distal end of each selected post or the selected component (e.g., portions of the selected component) to detach the selected component adhered to the selected post from the distal end of the selected post and from the selected post.

In some embodiments, selected components are first selected components, non-selected components are first non-selected components, and the method comprises: providing a destination substrate; transferring the first selected components to first component locations; selecting second selected components from among the first non-selected components, wherein the non-selected posts to which the second selected components are adhered are second selected posts; and transferring the second selected components to second component locations by irradiating the second selected posts through the body with the light to detach the second selected components adhered to the second selected posts from the second selected posts. In some embodiments, the components define an array, the first selected components are a first sparse subset of the array, and the second selected components are a second sparse subset of the array.

In some embodiments of the present invention, a micro-transfer printing system comprises a stamp comprising a body and spaced-apart posts protruding away from the body and a light source for controllably irradiating each of the posts with light. The body and the posts are substantially transparent to the light. In some embodiments, a component is adhered to each of the posts. In some embodiments, a component is adhered only to each of the non-selected posts. In some embodiments, each component comprises an ablation layer of ablative material that is in contact with the post to which the component is adhered. The ablation layer can be a patterned layer or an unpatterned layer and can be or comprise, for example, any one or more of a layer of metal, a layer of dielectric material, a layer comprising a dye, a layer comprising a black material, and a layer comprising carbon black.

In some embodiments of the present invention, the light emitted by the light source is non-visible light and the ablation layer is at least partially transparent to visible light, for example 50% transparent.

In some embodiments of the present invention, the micro-transfer printing system comprises an optical system operable to controllably direct light from the light source to the posts. Each of the posts can comprise a distal end away from the body and the optical system can be controllable to irradiate the distal end of one of the posts at a time or to irradiate a distal end of each of multiple ones of the posts at a time.

In some embodiments of the present invention, the micro-transfer printing system comprises a motion-control system operable to move the stamp in at least two directions. The motion-control system can be operable to controllably contact the posts to the components to adhere one of the components to each of the posts and remove the stamp from the component source wafer with a component adhered to the distal end of each of the posts.

In some embodiments, a micro-transfer printing system comprises a motion-control system including a motion platform sized and shaped to have a stamp attached or mounted thereto and a light source operable to controllably irradiate the posts with light when the stamp is attached or mounted to the motion platform. The motion-control system is operable to move the stamp in at least two directions. In some embodiments, the stamp comprises a body and spaced-apart posts protruding away from the body.

Certain embodiments of the present invention provide a system and method for micro-transfer printing multiple known-good die at one time from a native source wafer to a destination substrate. Certain embodiments of the present invention provide a system and a method for micro-transfer printing components having different characteristics using a single pickup (e.g., and multiple prints).

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
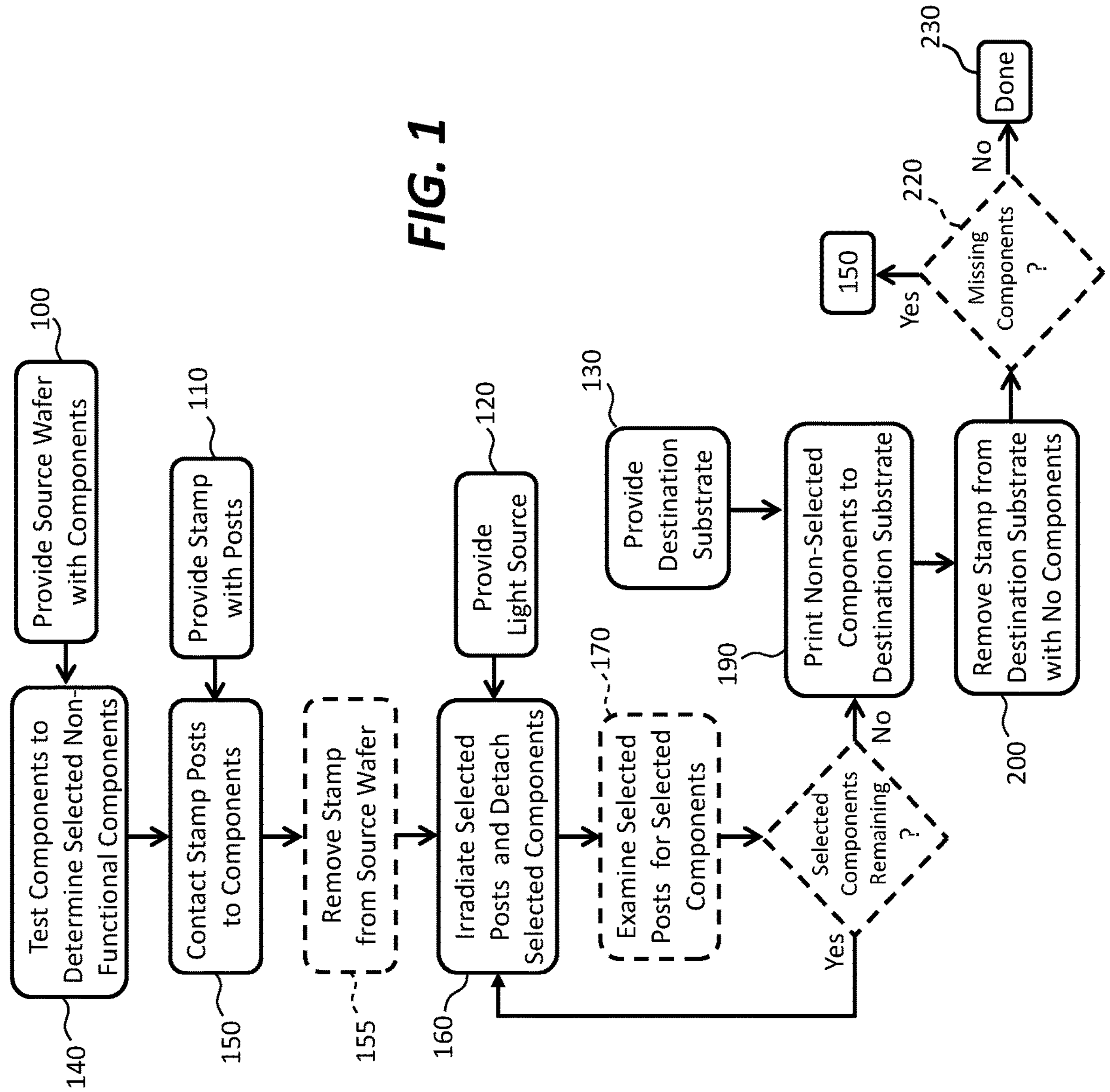
FIG. 1 is a flow diagram illustrating methods in accordance with some embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, or structurally similar elements. The figures are not necessarily drawn to scale.

DETAILED DESCRIPTION

The present invention provides, inter alia, methods and systems for constructing completely functional micro-transfer-printed systems. Such completely functional systems can comprise one or more functional components on a destination substrate, for example a display substrate. Methods and systems in accordance with certain embodiments of the present invention enable micro-transfer printing known-good components from a component source wafer to a destination substrate. For example, known-good components can be transferred to a destination substrate by picking up multiple components from the component source wafer with a stamp, removing selected components (e.g., faulty components) from the stamp, and micro-transfer printing the remaining non-selected components to the destination substrate. For example, known-good components can be transferred to a destination substrate by picking up multiple components from the component source wafer with a stamp and micro-transfer printing only selected (e.g., known-good) components to the destination substrate without micro-transfer printing non-selected (e.g., faulty) components. Methods and systems in accordance with certain embodiments of the present invention enable micro-transfer printing components from a component source wafer to a destination substrate independently from components having at least one different characteristic. Methods and systems in accordance with certain embodiments of the present invention enable micro-transfer printing components from a stamp to a destination substrate depending on the location of the components relative to the destination substrate so that different subsets of components adhered to the stamp are micro-transfer printed to different locations or areas of the destination substrate.

Figure 2:
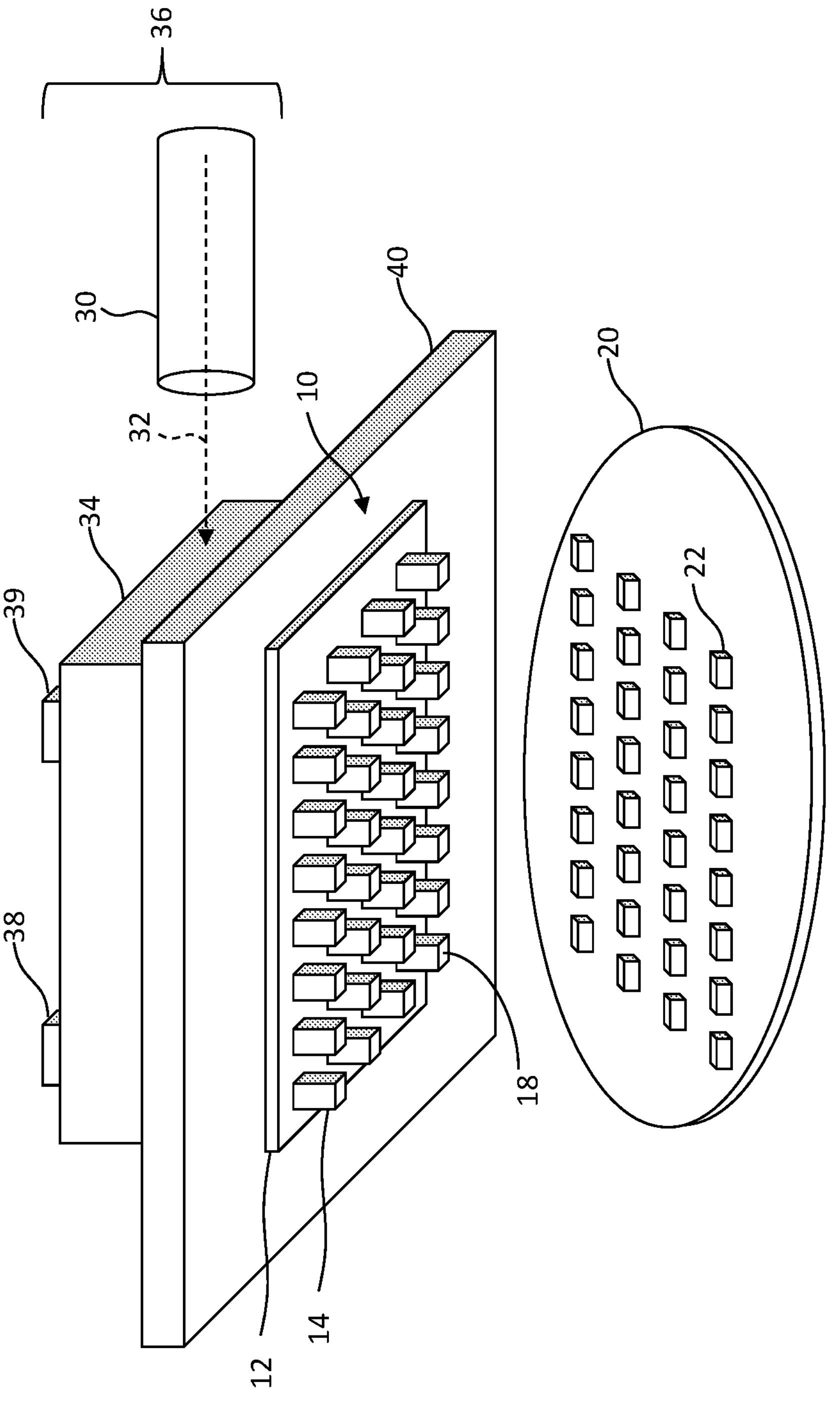
FIG. 2 is a schematic perspective of a component source wafer, stamp, motion, platform, and optical system illustrating some embodiments of the present invention.

Referring to the flow diagram of FIG. 1, the schematic perspective of FIG. 2, and the detail cross section of FIGS. 3-6, in some embodiments of the present invention, a method of micro-transfer printing comprises providing in step 100 a component source wafer 20 comprising components 22 disposed on or in component source wafer 20. Components 22 can be micro-transfer printable components 22. In some embodiments, component source wafer 20 comprises a patterned sacrificial layer 66 defining spaced-apart sacrificial portions 68 and anchors 64 and each component 22 is disposed over a sacrificial portion 68 and physically connected to an anchor 64 by a tether 62 (in some embodiments, a plurality of tethers 62, optionally connected to a plurality of anchors 64). A stamp 10 comprising a body 12 and spaced-apart posts 14 each protruding in a direction away from body 12 to a distal end 18 of post 14 is provided in step 110. Posts 14 can be in an array, for example evenly spaced in one or two dimensions (e.g., with equal or unequal spacing in each dimension). Distal end 18 of post 14 is the end of stamp post 14 farthest away from stamp body 12. The positioning of stamp 10 relative to component source wafer 20 can be controlled, for example, by a mechanical motion-control system including motion platform 40 for moving stamp 10 in x, y, and, optionally, z dimensions (e.g., horizontally and, optionally, vertically). In some embodiments, an alternative or additional motion platform for moving component source wafer 20 (e.g., horizontally and, optionally, vertically) is provided. Posts 14 have a spatial distribution on body 12 matched to a spatial distribution of components 22 on component source wafer 20.

In step 120, an optical system 36 comprising an optics controller 38 and light source 30 for controllably irradiating each post 14 with light 32 through body 12 using optics 34 is provided and, in some embodiments, can be positioned relative to stamp 10 by mechanical motion platform 40. Provided light source 30 can controllably irradiate each post 14 with light 32 through body 12. By controllably irradiating each post, it is meant that each of the posts 14 can be irradiated by light 32, or not, depending on whether post 14 is a selected post 15 or a non-selected post 16. That is, when non-selected posts 16 are controllably irradiated by light source 30, it is meant that non-selected posts 16 are not intentionally exposed to any light 32 from light source 30 (ignoring the possibility that a small amount of stray light may be incident on non-selected posts 16). In some embodiments, a light source 30 moves relative to optics 34 to controllably irradiate different selected posts 15. In some embodiments, one or more elements of optics 34 (e.g., one or more mirrors) move relative to a light source 30 to controllably irradiate different selected posts 15. In some embodiments, irradiation of each selected post 15 occurs automatically (e.g., due to automatic motion of one or more elements, such as optics 34, light source 30, stamp 10, component source wafer 20, or destination substrate 70) upon a start input being received (e.g., into optics controller 38). Body 12 and posts 14 can be substantially transparent to light 32 emitted by light source 30. Optics controller 38 is shown disposed on optics 34 in FIG. 2, but optics controller 38 can be remotely located and operable to receive and/or send signals, for example by one or more wires (e.g., cables) or wirelessly.

Figure 8:
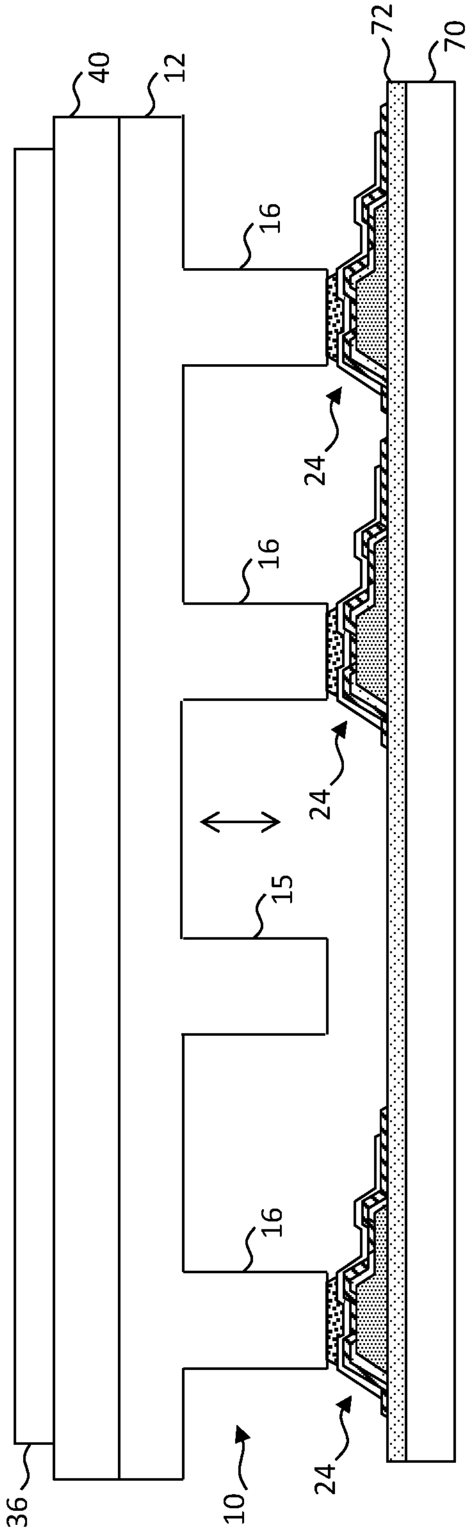
FIG. 8 is a schematic cross section of non-selected components printing to a destination substrate according to illustrative embodiments of the present invention.

Destination substrate 70 (e.g., as shown in FIG. 8) is provided in step 130 and, in some embodiments, can be positioned relative to stamp 10 by mechanical motion platform 40. Thus, in some embodiments of the present invention, mechanical motion platform 40 can move destination substrate 70 relative to stamp 10, can move stamp 10 relative to component source wafer 20, and can move light source 30 and optics 34 relative to stamp 10, or any combination of these. In some embodiments, an alternative or additional motion platform for moving destination substrate 70 (e.g., horizontally and, optionally, vertically) is provided. In some embodiments of the present invention, motion platform 40 can be provided in a variety of forms. In some embodiments, motion platform 40 is provided between at least a portion of optical system 36 (e.g., optics 34) and stamp 10. In some embodiments, motion platform 40 is provided such that at least a portion of optical system 36 (e.g., optics 34) is disposed between motion platform 40 and stamp 10. In some embodiments, motion platform 40 surrounds at least a portion of the perimeter of stamp 10. Motion platform 40 can be integrated with stamp 10 or optical system 36, for example.

Figure 4:
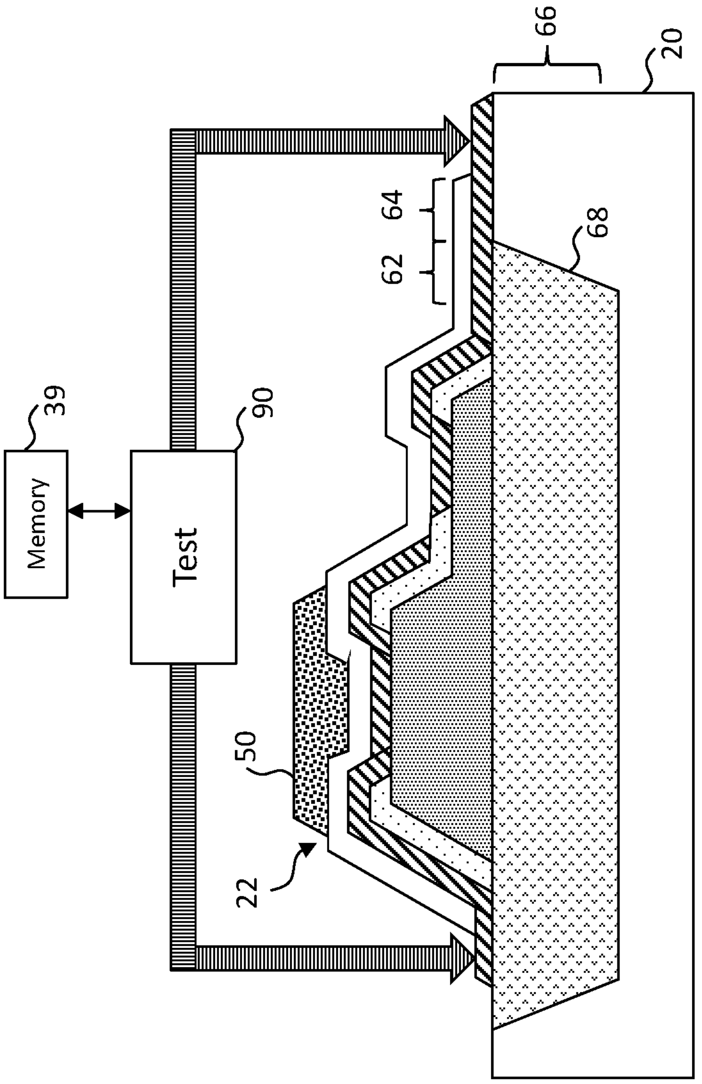
FIG. 4 is a schematic cross section of component testing on a component source wafer according to illustrative embodiments of the present invention.
Figure 5:
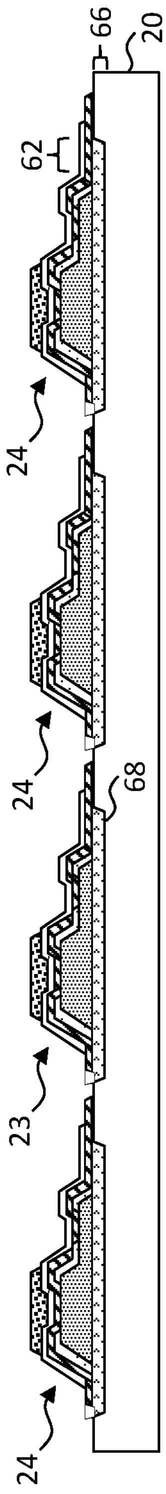
FIG. 5 is a schematic cross section of an array of selected and non-selected components on a component source wafer according to illustrative embodiments of the present invention.
Figure 6:
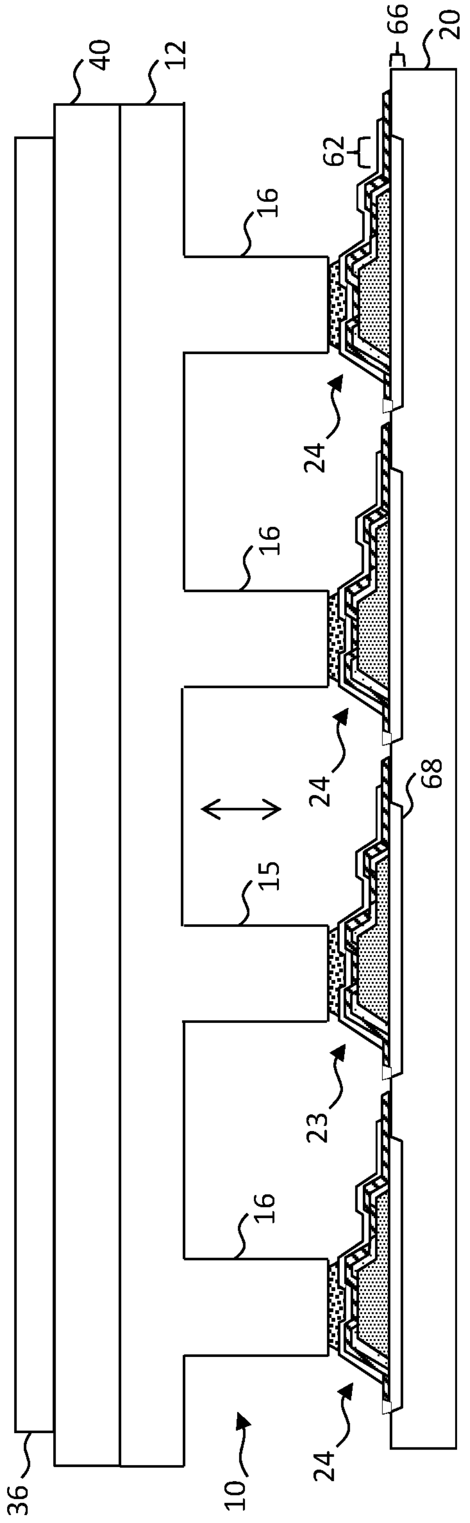
FIG. 6 is a schematic cross section of a stamp picking up components according to illustrative embodiments of the present invention.

Referring to FIG. 4, in step 140 each component 22 is tested, for example with test fixture 90, to determine if component 22 is functional (step 141). In some embodiments, testing electrically stimulates components 22 to respond with an electrical or optoelectrical response that is measured. In some embodiments, if a component 22 is not functional (i.e. component 22 is a faulty component) it is selected (a selected component 23) and if a component 22 is functional, it is not selected (a non-selected component 24), as shown in FIG. 5. (In some embodiments, if a component 22 is functional it is a selected component 23 and if a component 22 is not-functional (i.e. component 22 is a faulty component), it is a non-selected component 24.) Results of the test can be stored in memory 39 for example. (For illustration purposes, memory 39 is shown disposed on optics 34 in FIG. 2, but memory 39 can be remotely located and operable to receive and/or send signals, for example by one or more wires (e.g., cables) or wirelessly.) Memory 39 can be connected to optics controller 38 by one or more wires (e.g., cables) or wirelessly. Memory 39 can be part of optical system 36. In step 150 and as shown in FIG. 6, after removing sacrificial material from sacrificial portions 68, stamp 10 is moved by motion platform 40 so that distal end 18 of each post 14 is contacted to a component 22 (for both selected components 23 and non-selected components 24) to adhere a component 22 to distal end 18 of each post 14. Stamp 10 with adhered components 22 is then removed from component source wafer 20 in step 155, breaking (e.g., fracturing) or separating tethers 62 to form separated or broken tethers 63.

Figure 7A:
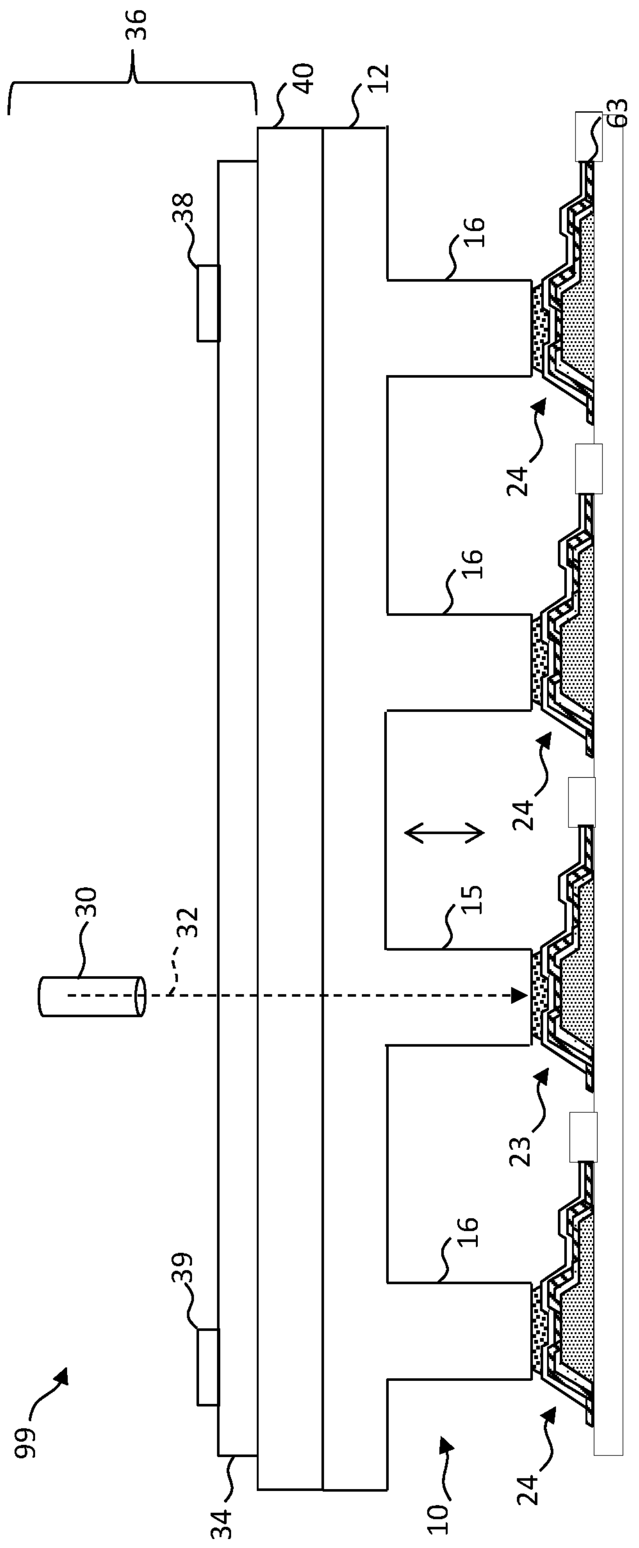
FIG. 7A is a schematic cross section of a selected component removal from a stamp according to illustrative embodiments of the present invention.
Figure 7B:
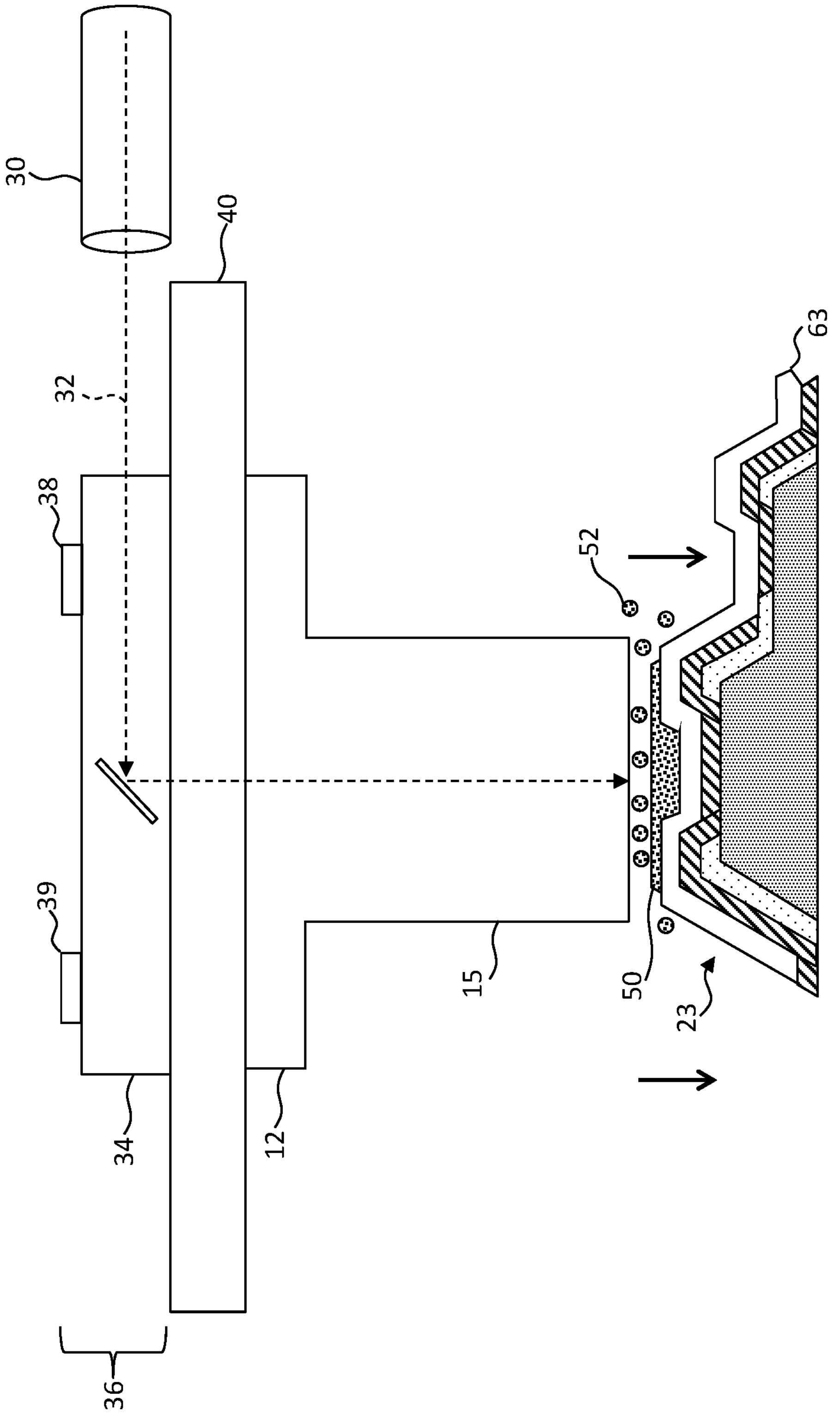
FIG. 7B is a detail schematic cross section of a selected component removal from a stamp corresponding to FIG. 7A according to illustrative embodiments of the present invention.

Referring to FIG. 7A and the detail of FIG. 7B, in response to test information stored in memory 39, optics controller 38 of optical system 36 controls light source 30 to emit light 32 through body 12 with optics 34 and irradiate each selected post 15 that contacts an adhered corresponding selected component 23 to detach the corresponding adhered selected (e.g., faulty) component 23 from selected post 15, leaving non-selected (e.g., known-good) components 24 adhered to corresponding non-selected posts 16. It is noted that FIGS. 7A and 7B show an example optical system 36 that has a different orientation of optics 34 and light source 30 than the example shown in FIG. 2.

In some embodiments of the present invention, selected posts 15 of stamp 10 can be irradiated to remove selected components 23 after moving stamp 10 to a disposal area in a location remote from component source wafer 20 and destination substrate 70 to avoid contamination of component source wafer 20 and destination substrate 70 with faulty selected components 23. In some embodiments, selected components 23 are lightly adhered to a disposal substrate so that irradiated selected components 23 adhere to the disposal substrate and non-selected components 24 that are not irradiated do not adhere to the disposal substrate.

In some embodiments of the present invention, selected posts 15 of stamp 10 can be irradiated while posts 14 are in contact with components 22 while components 22 are on component source wafer 20, so that only non-selected components 24 are adhered to non-selected posts 16 when stamp 10 is removed from component source wafer 20. In some embodiments, the steps of irradiation and removal of stamp 10 from selected components 23 occur at the same time, occur partially at the same time, or overlap in time. By removing stamp 10 (with non-selected components 23 adhered to non-selected posts 16) from component source wafer 20 during the irradiation, selected components 23 are prevented from re-adhering to selected posts 15 after the irradiation is complete. Referring to FIG. 8, in some embodiments non-selected components 24 on non-selected posts 16 are contacted to destination substrate 70 to adhere non-selected components 24 to destination substrate 70 in step 190 and stamp 10 is removed from destination substrate 70 in step 200 with no components 22 adhered to stamp 10. Thus, only components 22 that are tested and known to be good are transferred to destination substrate 70. In some embodiments, selected components 23 are in contact with destination substrate 70 during the irradiation process. In some embodiments, selected components 23 are not in contact with destination substrate 70 during the irradiation process. For example, selected components 23 can be within 20 μm (e.g., within 10 μm, within 5 μm, within 2 μm, or within 1 μm) of destination substrate 70, but not in contact, during irradiation. Destination substrate 70 is shown coated with optional adhesive layer 72 such that non-selected components 24 directly contact adhesive layer 72. In some embodiments, no such adhesive layer is present (e.g., such that non-selected components 24 are directly printed onto destination substrate 70).

In some embodiments, after known-good components 22 are micro-transfer printed to destination substrate 70, any components 22 determined to be missing (step 220) can be printed by repeating the printing process until no components 22 are missing and the process is done (step 230). For example, one or more missing components 22 can be printed by only picking up and testing a single component 22 at a time and printing the single component 22 (e.g., if it is a functional component 22).

In some embodiments, ablation occurs during irradiation that leads to component 22 separation. Selected components 23 can be forcibly ejected from selected posts 15 due to ablation (e.g., of an ablation layer 50 of selected components 23 disposed in contact with selection posts 15). In some embodiments, selected components 23 are detached from selected posts 15 by a shear force that forms between selected posts 15 and selected components 23 when the selected posts 15 and selected components 23 have a CTE mismatch and are, for example, heated (e.g., by irradiation). Non-selected components 24 on non-selected posts 16 are not detached from the non-selected posts (e.g., because no differential thermal expansion occurs between the non-selected posts 16 and non-selected components 24) and are not adhered to the substrate when stamp 10 is removed from the substrate. A CTE mismatch can occur with or without the presence of an ablation layer 50 in components 22.

Optionally, after selected posts 15 are irradiated to detach selected components 23, selected posts 15 can be examined in step 170 to verify that selected components 23 are indeed detached (step 180). Such a determination can be made using an optical camera and one or more image recognition techniques, for example. If any selected components 23 are still attached to selected posts 15, irradiation step 160 can be repeated for selected posts 15 with attached selected components 23 (or all selected posts 15). In step 150, missing components 22 are determined and additional components 22 from a component source wafer 20 that are tested and known to be good can be printed to locations on destination substrate 70 that were not printed with non-selected components 24 in step 190.

The method illustrated in FIG. 1 comprises removing selected (faulty) components 23 from stamp 10 before printing non-selected (known-good) components 24 to destination substrate 70. In some embodiments of the present invention, selected (known-good) components 23 in contact with destination substrate 70 can be removed from stamp 10 and non-selected (faulty) components 24 removed with stamp 10 from destination substrate 70. In such embodiments, if a component 22 is functional it is selected (a selected, known-good component 23); if a component 22 is not functional, it is not selected (a non-selected faulty component 24). This selection criterion is the inverse of the selection criterion for the illustrative embodiment in FIG. 1.

Figure 9:
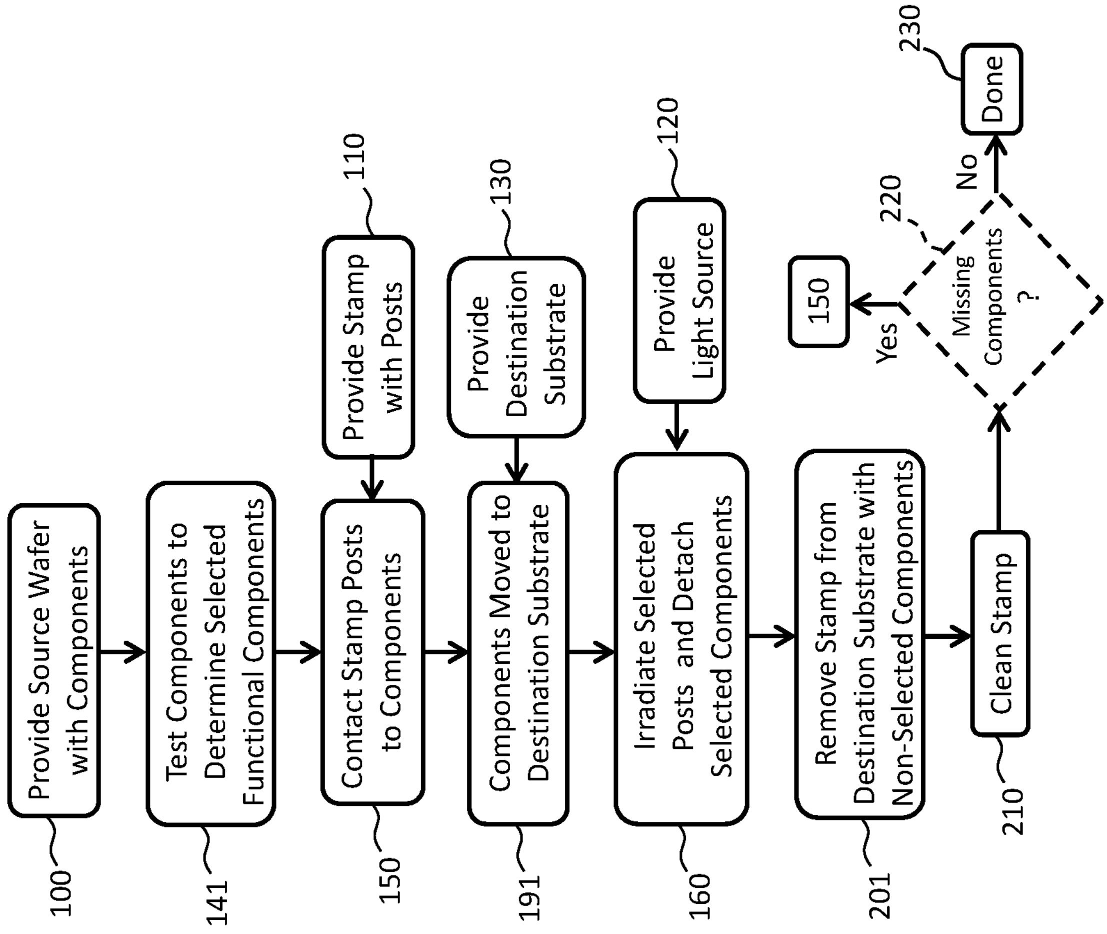
FIG. 9 is a flow diagram illustrating methods in accordance with some embodiments of the present invention.
Figure 10:
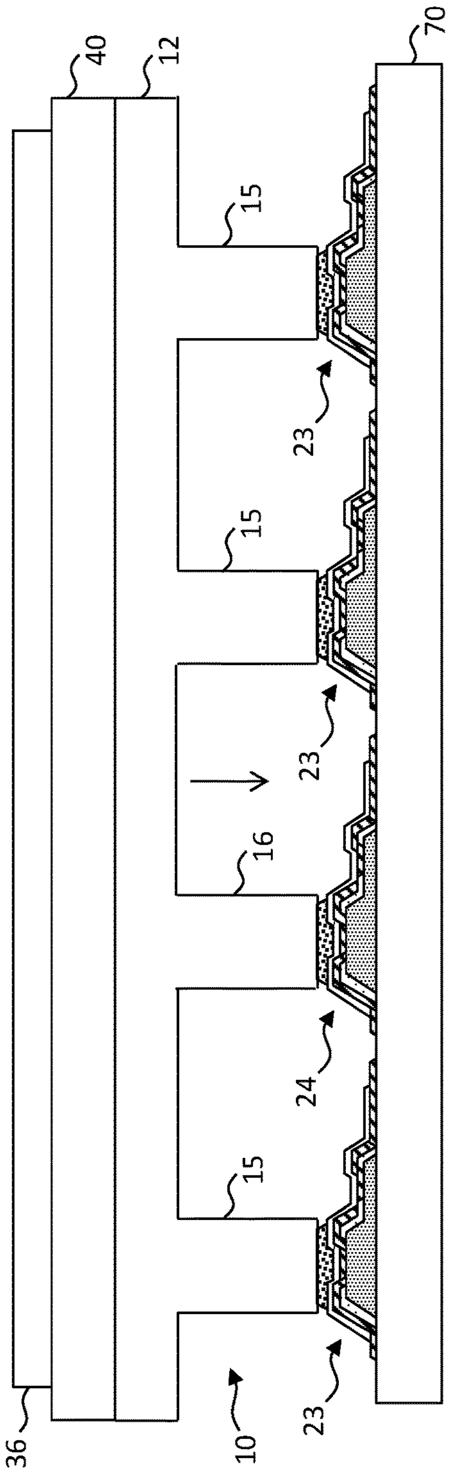
FIG. 10 is a schematic cross section of components printing to a destination substrate according to illustrative embodiments of the present invention.
Figure 11:
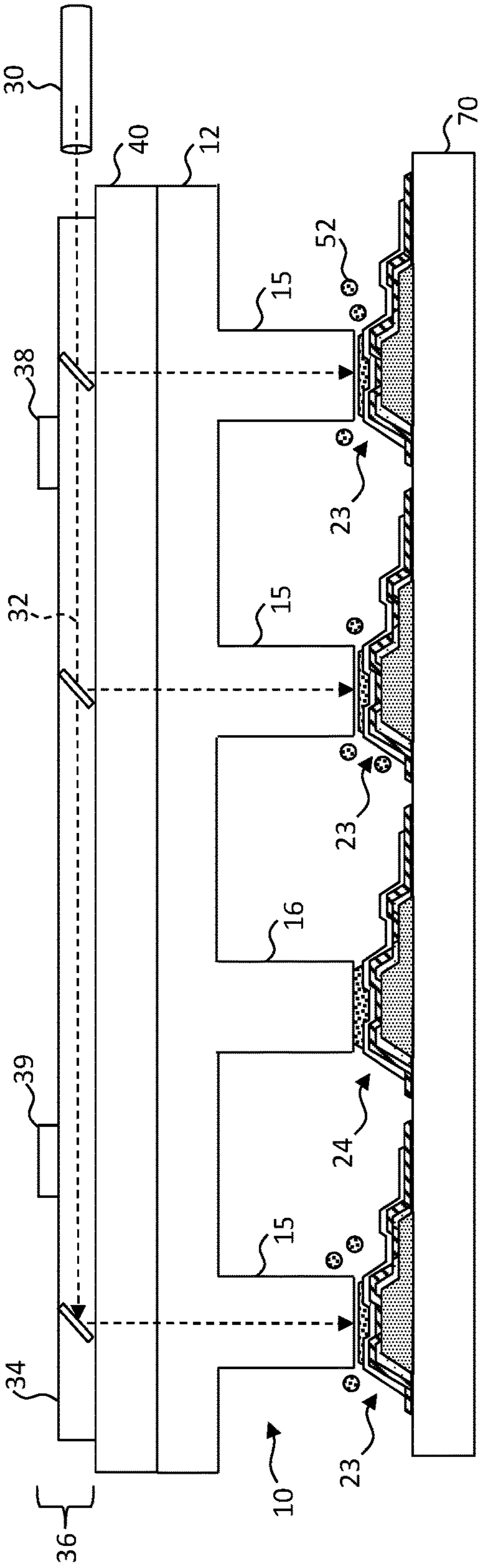
FIG. 11 is a schematic cross section of selected component removal from a stamp according to illustrative embodiments of the present invention.
Figure 12:
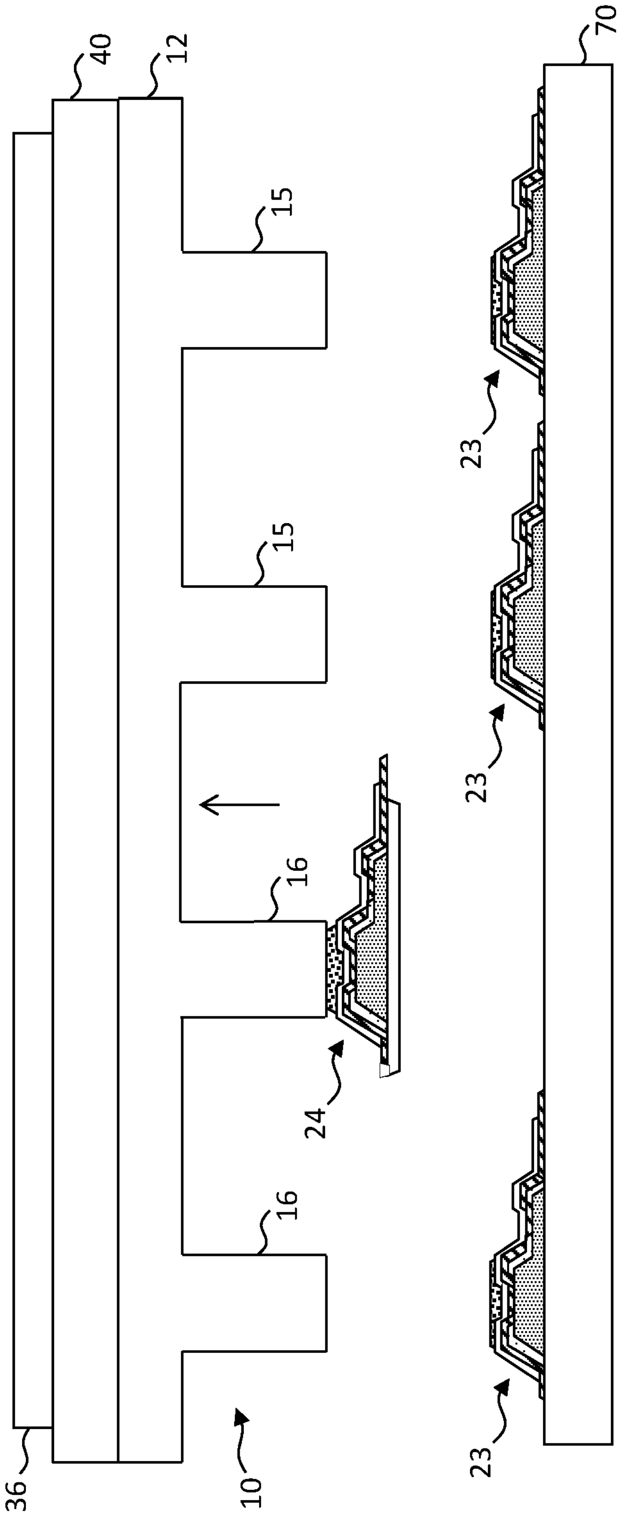
FIG. 12 is a schematic cross section of stamp removal of a non-selected component from a destination substrate removal according to illustrative embodiments of the present invention.

Referring to FIG. 9, in some embodiments of the present invention, steps 100-150 are performed as described above. However, rather than removing selected (non-functional) components 23 from selected posts 15 of stamp 10, for example as in step 160 of FIG. 1, all components 22 adhered to posts 14 of stamp 10 are contacted or located closely adjacent to or above destination substrate 70, as shown in step 191 and FIG. 10. In step 160 and as shown in FIG. 11, distal ends 18 of selected posts 15 in contact with selected (functional) components 23 are irradiated to detach selected components 23 from distal ends 18 of selected posts 15. Stamp 10 is then removed from destination substrate 70 with non-selected (non-functional) components 24 in contact with non-selected posts 16 in step 201 and as shown in FIG. 12. The irradiation and removal steps 160, 201 can be executed simultaneously or overlap in time to facilitate detachment of selected (known-good) components 23 and removal of non-selected (faulty) components 24. In some embodiments, after known-good components 22 are micro-transfer printed to destination substrate 70, any components 22 missing from destination substrate 70 can be determined in step 220 and printed by repeating the printing process including step 150. For example, one or more missing components 22 can be printed by only picking up and testing a single component 22 at a time and printing the single component 22 (e.g., if it is a functional component 22).

In some embodiments, selected components 23 are in contact with destination substrate 70 during the irradiation process. In some embodiments, selected components 23 in contact with destination substrate 70 and selected components 23 are removed from selected posts 15 during irradiation, so that the steps of irradiation and removal of stamp 10 from selected components 23 occur at the same time, occur partially at the same time, or overlap in time. By removing selected posts 15 (with the stamp 10) from selected components 23 during the irradiation, selected components 23 are prevented from re-adhering to selected posts 15 after the irradiation is complete. In some embodiments, selected components 23 are adjacent to but not in contact with destination substrate 70 so that selected components 23 are detached from selected posts 15 and selected components 23 travel (e.g., drop) from selected posts 15 to destination substrate 70. For example, selected components 23 can be within 20 μm (e.g., within 10 μm, within 5 μm, within 2 μm, or within 1 μm) of destination substrate 70, but not in contact, when detached.

In some embodiments, an ablation layer 50 is ablated to detach selected components 23 from selected posts 15. Selected components 23 can be forcibly ejected from selected posts 15 and propelled onto destination substrate 70. In some such embodiments, a gap between selected components 23 and destination substrate 70 can enable the transfer of selected components 23 to destination substrate 70 without re-adhesion of selected components 23 to selected posts 15. Re-adhesion can result in a failed transfer. In some embodiments, shear force formed between selected posts 15 and selected components 23, for example by heating and a CTE mismatch between selected posts 15 and selected components 23, causes detachment of selected components 23 from selected posts 15. Selected components 23 can contact destination substrate 70 to enable adhesion of selected components 23 to destination substrate 70, promoting transfer. A CTE mismatch can occur with or without the presence of an ablation layer 50 in components 22.

Stamp 10 can then be cleaned in step 210. As an example, stamp 10 can be cleaned by contacting non-selected components 24 to an adhesive cleaning surface in a disposal area (e.g., a sticky tape). As an example, stamp 10 can be cleaned by irradiating distal ends 18 of non-selected posts 16 in a suitable disposal location to remove non-selected components 24 from non-selected posts 16. In some embodiments, after known-good components 22 are micro-transfer printed to destination substrate 70, any components 22 determined to be missing (step 220) can be determined in step 150 and printed by repeating the printing process until no components 22 are missing and the process is done (step 230). For example, one or more missing components 22 can be printed by only picking up and testing a single component 22 at a time and printing the single component 22 (e.g., if it is a functional component 22).

According to some embodiments of the present invention, and as shown in FIG. 7A, a micro-transfer printing system 99 comprises a stamp 10 that comprises a body 12 and spaced-apart posts 14 protruding away from body 12. A light source 30 can controllably (e.g., selectively) irradiate each selected post 15 with light 32. (Light 32 can generally be any electromagnetic radiation, such as, for example, visible light, ultraviolet light, or infrared light.) In some embodiments, a component 22 (either a selected component 23 or a non-selected component 24) is adhered to each post 14. Body 12 and posts 14 are substantially transparent to light 32 emitted by light source 30. By substantially transparent it is meant that light 32 from light source 30 can pass through body 12 and posts 14 with sufficient luminance to detach components 22 from distal end 18 of selected posts 15. As a non-limiting example, a body 12 and posts 14 that are substantially transparent to light 32 from a light source 30 can be at least 70% (e.g., at least 80% or at least 90%) transparent. Posts 14 and body 12 can be made from a same material or comprise different materials. Irradiation of selected posts 15 can irradiate a distal end 18 of selected posts 15, can irradiate selected components 23 adhered to distal ends 18 of selected posts 15, can irradiate a portion of selected components 23 adhered to distal ends 18 of selected posts 15, can irradiate a layer of selected components 23 adhered to distal ends 18 of selected posts 15, or any combination of these. Irradiating a selected post 15 with an adhered selected component 23 detaches (e.g., causes detachment of) the selected component 23 from the distal end 18 of the selected post 15.

In some embodiments, components 22 comprise an ablation layer 50 of ablative material 52 in contact with each post 14 to which a component 22 is adhered (e.g., adhered to distal end 18 of selected post 15). Ablative material 52 is chosen to absorb light 32 emitted from light source 30, for example to selectively absorb light 32 from light source 30, and, in some embodiments, decomposes (e.g., vaporizes) in response to the absorption. Ablative material 52 can be at least partially transparent to visible light and light 32 emitted from light source 30 can be invisible, for example infra-red or ultra-violet. Thus, in some embodiments, light 32 emitted by light source 30 is non-visible light and ablation layer 50 is at least partially transparent to visible light, for example at least 30% (e.g., at least 40%, at least 50%, at least 70%, at least 80%, or at least 90%) transparent to visible light. Ablation of ablation layers 50 detaches (e.g., assists in detaching along with stamp 10 motion) selected components 22 from posts 15.

In some embodiments, stamp 10 is a visco-elastic stamp 10, for example a PDMS (polydimethylsiloxane) stamp 10. Body 12 and posts 14 can be made from a same material (e.g., PDMS) and have different mechanical properties (e.g., due to a different composition of the material in the body 12 and posts 14). In some embodiments, light source 30 is a laser. In some embodiments, an optical system 36 (e.g., comprising optics 34, light source 30, and optics controller 38) controllably directs light 32 from light source 30 to one or more posts 14, e.g., selected posts 15. In some embodiments, optical system 36 (light source 30, optics controller 38, and optics 34) is controllable to irradiate a distal end 18 of one selected post 15 at a time (e.g., using one or more wave guides, lenses, or mirrors). In some embodiments, light source 30 or optics 34 move, and subsequently light source 30 emits light 32, during controlled irradiation such that each emission of light 32 irradiates only one selected post 15 due to alignment between light source 30, optics 34, and one selected post 15. In some embodiments, optical system 36 is controllable to irradiate distal ends 18 of multiple selected posts 15 at a time (e.g., using one or more wave guides, lenses, beam splitters, or mirrors). In some embodiments, light source 30 or optics 34 move, and subsequently light source 30 emits light 32, during controlled irradiation such that each emission of light 32 irradiates multiple selected posts 15 due to alignment between light source 30, optics 34, and multiple selected posts 15 (e.g., where multiple selected posts 15 are only a portion or all of selected posts 15).

In some embodiments, micro-transfer printing system 99 comprises memory 39. In some embodiments, memory 39 can store a mapping of selected components 23 and non-selected components 24. A mapping can correspond to locations of selected components 23 and non-selected components 24 on component source wafer 20, for example. In some embodiments, a mapping of selected components 23 and non-selected components 24 is formed or determined based, at least in part, on input from test fixture 90. In some embodiments, a mapping of selected components 23 and non-selected components 24 is formed or determined based, at least in part, on known locations of a first set of components 22 and a second set of components 22, the sets disposed on or in a component source wafer 20 and the second set having at least one characteristic different from the first set. In some embodiments, a mapping of selected components 23 and non-selected components 24 is formed or determined based, at least in part, on known locations of a first set of components 22 and a second set of components 22 on a destination substrate 70 after their printing. A mapping can be used by optics controller 38 for controllably irradiating selected posts 15. Irradiating selected posts 15 can occur automatically (e.g., by automatic and controlled movement of optics 34 and/or light source 30 relative to stamp 10), for example, when using a mapping.

In some embodiments, micro-transfer printing system 99 comprises a motion-control system (e.g., including motion platform 40) for moving stamp 10 (e.g., relative to component source wafer 20) and, optionally, relative to at least some portions of optical system 36. In some embodiments, a motion-control system can move stamp 10 between a location corresponding to component source wafer 20 (e.g., over component source wafer 20) and a location corresponding to destination substrate 70 (e.g., over destination substrate 20) and, optionally, vertically, for example when in the location corresponding to the component source wafer 20 or the destination substrate 70. In some embodiments, a motion-control system can also move stamp 10 to a disposal area (e.g., with a disposal substrate in the disposal area). In some embodiments, stamp 10 is mounted or attached to a motion-control system (e.g., a motion platform 40 of the motion-control system). Stamp 10 can be mounted or attached to a motion-control system by, for example, one or more clamps, one or more fasteners, one or more braces, or adhesive. In some embodiments, micro-transfer printing system 99 comprises a component source wafer 20 comprising micro-transfer printable components 22. A motion-control system can be adapted to controllably contact posts 14 to components 22 to adhere a component 22 to each post 14 and remove stamp 10 from component source wafer 20 with each component 22 adhered to a distal end 18 of a post 14.

In some embodiments, each post 14 comprises a distal end 18 that protrudes away from body 12, components 22 are adhered to distal end 18 of selected posts 15, and light source 30 controllably irradiates distal end 18 of each selected post 15.

Component source wafer 20 can be any wafer suitable for the assembly or construction of components 22 on patterned sacrificial portions 68, for example glass, mono-crystalline semiconductor (e.g., silicon) or compound semiconductor (e.g., GaN or GaAs), quartz, sapphire, or ceramic. Component source wafers 20 can have a diameter, for example, greater than or equal to 10 cm (e.g., greater than or equal to 15 cm, 20 cm, 25 cm, 30 cm, 40 cm, or 100 cm). In some embodiments, a component source wafer 20 has a diameter that is less than or equal to 200 cm. Suitable component source wafers 20 are found in the semiconductor, integrated circuit, and display industries and can be processed, for example, using photolithographic methods and materials. Patterned sacrificial layer 66 can be a patterned oxide or nitride layer (such as silicon oxide or silicon nitride) that is differentially etchable from the remainder of component source wafer 20 or can be a layer comprising designated portions in a layer of component source wafer 20 (e.g., etchable portions under components 22). In some embodiments, component source wafer 20 comprises an anisotropically etchable crystalline material (such as silicon) that can be anisotropically etched to remove material from sacrificial portions 68 to release components 22 from component source wafer 20, leaving components 22 each attached by one or more tethers 62 to one or more anchors 64.

Referring back to FIG. 3, components 22 can be any of a wide variety of devices, such as, for example but not limited to, electronic, optical, optoelectronic, mechanical, or piezoelectric devices. Components 22 can be optically emissive or responsive and can be light emitters (such as LEDs), light sensors (such as photodiodes), lasers, or electrical jumpers. Components 22 can be integrated circuits (for example CMOS, bipolar, or mixed circuits) and comprise electronically active or passive elements or both. Components 22 can be constructed using photolithographic methods and materials. Components 22 can have, for example, at least one of a width, length, and height from 2 μm to 1000 μm (for example 2 to 5 μm, 5 to 10 μm, 10 to 20 μm, 20 to 50 μm, 50 μm to 100 μm, 100 μm to 250 μm, 250 μm to 500 μm, or 500 μm to 1000 μm). Components 22, for example, can have a doped or undoped semiconductor structure 82 substrate thickness from 2 μm to 50 μm (for example from 2 to 5 μm, 5 to 10 μm, 10 to 20 μm, or 20 to 50 μm). Components 22 can have a length greater than width, for example having an aspect ratio greater than or equal to 2 (for example greater than or equal to 4, 8, 10, 20, or 50). Components 22 can comprise component contact pads 83 that are adjacent to the ends of components 22 along the length of components 22 to provide electrical contact to components 22. Components 22 can comprise a patterned dielectric layer 87 to provide electrical insulation and electrodes 84 to provide electrical connection to component contact pads 83. An encapsulation layer 88 (for example a second dielectric layer of silicon dioxide or nitride) can protect components 22 and, optionally, provide a tether 62. An optional ablation layer 50 of ablative material 52 can be provided, for example using photolithographic process and materials, on a surface of components 22 that is contacted by distal end 18 of posts 14.

In some embodiments, subsets of components 22 disposed on or in component source wafer 20 have one or more different characteristics that are not merely natural variation within manufacturing tolerances of components 22. A characteristic that is different between two components 22 can be, for example, size, shape, an optical property, an electronic property (e.g., piezoelectricity), or a mechanical property. For example, a different characteristic can be emission wavelength (e.g., if components 22 are light emitters), circuit design (e.g., if components 22 are controllers, such as micro-controllers), or properties that are sensed or sensitivity to those properties (e.g., if components 22 are sensors). If components 22 disposed on or in component source wafer 20 are light emitters, a characteristic that is different can be, for example, color (e.g., emission wavelength), hue, tint, shade, brightness, efficiency, or angular distribution of emitted light. Selected ones of components 22 can be selected based on a characteristic that they have, with non-selected ones of components 22 having at least one different characteristic. In some embodiments, non-selected components 24 having a different characteristic are micro-transfer printed in a later step (e.g., after moving a position of stamp 10 having non-selected components 24 still disposed thereon relative to destination substrate 70). In some embodiments, selected components 23 are not uniform, for example selected components 23 can comprise components 22 having different characteristics. For example, selected components 23 can include two or more colors of light-emitting diodes.

A first set of components 22 disposed on or in component source wafer 20 can be interspersed with (or adjacent to) a second set of components 22 disposed on or in component source wafer 20 that has at least one different characteristic. In some embodiments, component source wafer 20 is fabricated having a known distribution of a first set of components 22 and a second set of components 22, the first set of components 22 having at least one characteristic different from a characteristic of the second set of components 22. Selected components 23 can be or comprise either the first set or the second set (with non-selected components 24 being or comprising the other set) (e.g., independent of whether selected components 23 and/or non-selected components 24 comprises one or more faulty components 22). A mapping can be formed or determined based on the known distributions of the first set and the second set and, for example, input into memory 39 in order to micro-transfer print the first set or the second set independent of the other set (e.g., using steps described above). Components 22 having different characteristics can be fabricated on a single component source wafer 20 (as opposed to multiple component source wafers 20) in order to more efficiently utilize valuable material and/or reduce manufacturing steps, thereby reducing costs. For example, different color light-emitting-diodes can be fabricated on a single component source wafer 20 or different integrated circuits can be fabricated on a single component source wafer 20.

Figure 13:
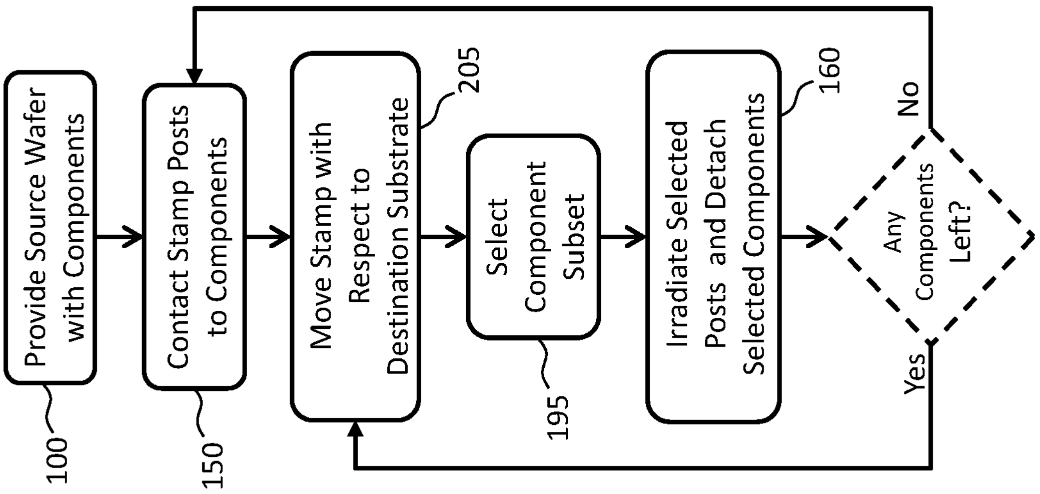
FIG. 13 is a flow diagram illustrating a method in accordance with some embodiments of the present invention.
Figure 14C:
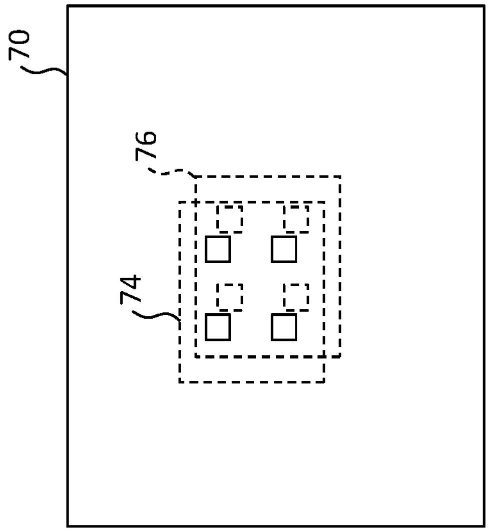
FIGS. 14A-14C are schematic plan views of first and second locations printed to in successive printings on a destination substrate, according to illustrative embodiments of the present invention.
Figure 14B:
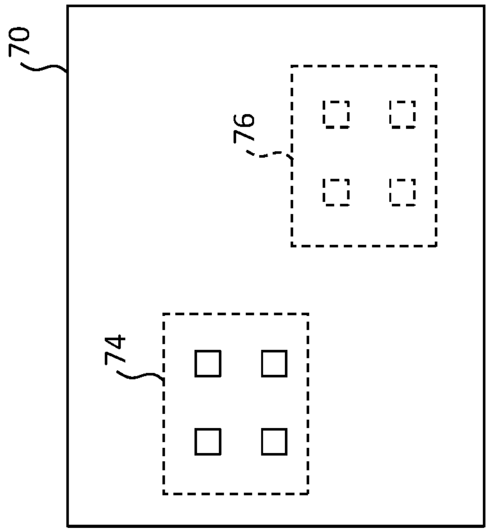
Figure 14A:
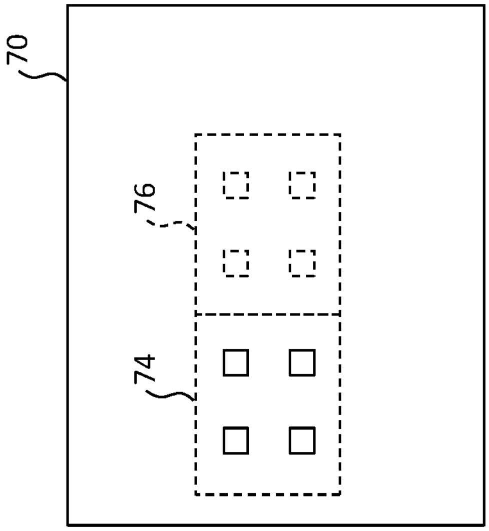

In some embodiments, subsets of components 22 adhered to stamp 10 are repeatedly selected and transferred to destination substrate 70. For example, referring to flow diagram FIG. 13, an array of components 22 can be picked up by stamp 10 in step 150 and moved by motion platform 40 to a location with respect to destination substrate 70 in step 205, for example components 22 adhered to stamp 10 are contacted or located closely adjacent to and above destination substrate 70. Selected components 23 representing a subset of components 22 adhered to stamp 10, for example a sparse array of components 22, are selected in step 195 and transferred to first locations 74 on destination substrate 70 by irradiation in step 160, for example as described above. (The selection step 195 can be done at any convenient time, for example, but not limited to, before stamp 10 is moved.) If all of components 22 are transferred and none remain adhered to stamp 10, the process is completed and can be repeated by picking up a new set of components 22 from component source wafer 10 in step 150. If some components 22 remain adhered to stamp 10 (e.g., some of the components were non-selected components 24 during the first printing), the process is repeated by moving stamp 10 to a new location (such that a second subset of components 22 are in second locations 76) over destination substrate 70 (step 205), a different subset of components 22 adhered to stamp 10 is selected (step 195) and transferred to destination substrate 70 (step 160). Subsets of components 22 disposed on stamp 10 (and selected as selected components 23 in successive printing operations) can be interspersed or separated (e.g., adjacent). Second locations 76 on destination substrate 70 can be adjacent, disjointed, or overlapping to first locations 74 in which a first subset of components 22 have already been printed, as shown, for example, in FIG. 14A, FIG. 14B, and FIG. 14C, respectively. For example, a first subset of components 22 in a first locations 76 can be interspersed with a second subset of components 22 disposed in a second locations 76. A distance between second locations 76 and first locations 74 can be less than a characteristic separation of a first subset of components 22 that have been disposed in first locations 74.

Thus, components 22 can be distributed in a variety of arrangements on destination substrate 70 different from the arrangement of components 22 on stamp 10 with multiple printing steps and without having to pick up additional components 22 from component source wafer 20, thereby improving the printing throughput and print location flexibility. For example, a 4×4 array of components 22 can be picked up by stamp 10 from component source wafer 10, a first 2×2 subset of the 4×4 array is selected and transferred to first locations 74 on destination substrate 70, then a second 2×2 subset of the remaining twelve components 22 in the 4×4 array is selected and transferred to second locations 76 on destination substrate 70, then a third 2×2 subset of the remaining eight components in the 4×4 array is selected and transferred to third locations on destination substrate 70, and then the remaining four components in the 4×4 array are selected and transferred to fourth locations on destination substrate 70. If the 2×2 arrays comprise, for example, every other component 22 of the 4×4 array of components 22 in one or two dimensions, then the 2×2 arrays are sparse and the printed area of destination substrate 70 can be larger than the area of the 4×4 array, resulting in geometric magnification of the 4×4 printed area on destination substrate 70 with respect to the area of component source wafer 10 from which the 4×4 array of components 22 was picked up. In some embodiments, the arrangement or number of selected components 23 transferred to destination substrate 70 is different in different transfer steps. By performing a single component pick up from the component source wafer 20 and four printing steps, throughput is improved.

Figure 3:
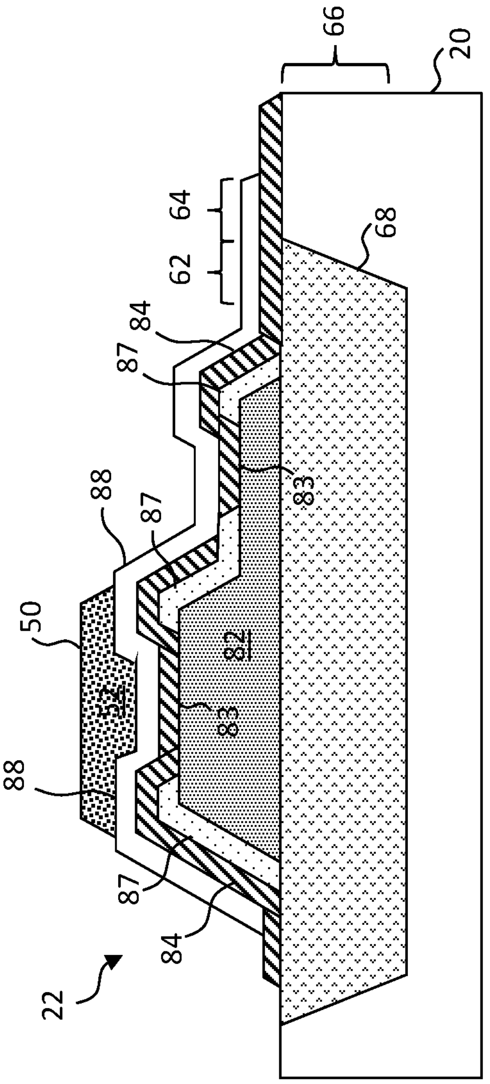
FIG. 3 is a schematic cross section of a component source wafer with a component according to illustrative embodiments of the present invention.

Test fixture 90 can be an electronic, mechanical, optical, or combination fixture. Generally, test fixture 90 can include any combination of elements that senses a response from components 22. In some embodiments, test fixture 90 provides power to components 22 for testing purposes. Test fixture 90 can be constructed and arranged to test only one component 22 or a plurality of components 22 at a time. For example, test fixture 90 can be a bed-of-nails electronic probe with circuits for providing electrical power to components 22 through electrodes 84 and component contact pads 83 and electronic or optical sensing circuits for sensing and measuring a response of components 22. In some embodiments, component source wafer 20 comprises wires (electrical conductors) electrically connected to components 22 through electrodes 84 and component contact pads 83 and controlled by test fixture 90, for example as shown in FIG. 4. The wires can be routed over or under tethers 62 or form a portion of tethers 62 and/or formed over exposed portions of sacrificial portions 68 and subsequently removed (e.g., by unpatterned or patterned etching) before pickup by stamp 10. Examples of such wires are shown in FIGS. 3 and 4, where wires 83 connected to contact pads 83 are exposed on a portion of sacrificial portion 68 and extending past anchor 64, thereby allowing for a closed circuit to be formed for testing. Additional examples of such wires are described in U.S. Pat. Nos. 9,923,133 and 9,142,468, both entitled Structures and methods for testing printable integrated circuits. Test fixture 90 can comprise a computer for controlling components 22 and measuring, analyzing, reporting, and storing test information and results in memory 39. Testing with test fixture 90 can be done either before, or after, sacrificial material in sacrificial portion 68 is removed, e.g., by etching.

Motion platform 40 can be a computer-controlled electro-mechatronic assembly, for example comprising stepper motors for providing multi-axis movement of the platform. Motion platform 40 can comprise a transparent structure (for example a glass or transparent polymer plate) in a fixture for holding stamp 10 and allowing light 32 to pass through the transparent structure to enter stamp 10. Suitable motion platforms 40 are commercially available or can be adapted for use in a micro-transfer printing system 99.

Light source 30 can be a laser that emits laser light 32 (e.g., into optics 34). Optics 34 can comprise, for example, one or more of one or more mirrors, one or more refractive lenses, one or more diffractors, one or more acousto-optic modulators (AGMs), one or more electro-optic modulators (EOMs), one or more beam splitters, and one or more rotating polygonal mirrors to control emitted light 32. For example, light 32 from light source 30 can be scanned over the back surface of stamp 10 and posts 14 and temporally controlled to irradiate any particular selected post 15 (or group of selected posts 15), or not by a real-time electronic/computer controller. Optics controller 38 can receive information from test fixture 90 to specify selected components 23 and selected posts 15. For example, a mapping of selected component 23 locations and non-selected component 24 locations can be formed based, at least in part, on input from test fixture 90, and used by optics controller 38 for controllably irradiating selected posts 15. Suitable or adaptable examples of optical systems 36 and light-control methods and devices are known in the art. In some embodiments, at least some elements of optical system 36 can be moved by motion platform 40 relative to stamp 10 to align light 32 emitted by light source 30 with selected posts 15 and selected components 23. In some such embodiments, light 32 is mechanically scanned over the selected posts 15. Hence, in some embodiments, single selected posts 15 are irradiated at a time to sequentially detach selected components 23. In some embodiments, more than one selected post 15 is irradiated at a time, for example using optics 34 to divide a laser beam (e.g., light 32) into multiple beams. In some embodiments, light source 30 is constructed and disposed such that no optics are needed to controllably irradiate each of the posts 14 in stamp 10. For example, if light source 30 is disposed over stamp 10 and has a small beam width, light source 30 alone can be sufficient to provide controllable irradiation of posts 14 (e.g., by movement of stamp 10 or light source 30).

Stamps 10 having protruding posts 14 used for micro-transfer printing that can be used in systems and methods described herein are described in U.S. Pat. No. 9,412,727 entitled Printing transferable components using microstructured elastomeric surfaces with pressure modulated reversible adhesion. Such stamps 10 can comprise PDMS (polydimethylsiloxane with or without an additive, such as Dow Sylgard 184 Elastomer Base and Curing Agent by Dow Corning Corporation of Auburn, Mich.). Stamp 10 can be made by providing a photolithographically defined mold structure that holds a support in alignment with a stamp mold. The stamp mold can provide a body cavity and one or more structured cavities (e.g., defining posts 14). A liquid curable material is injected into the mold cavity and the assembly is subjected to heat to cure the liquid curable material to form the layer corresponding to the mold. The mold is removed from the mold structure and the stamp 10 removed from the mold.

Stamp body 12 can have a range of thicknesses from 0.50 μm to 1000 μm (e.g., 200 μm). Stamp posts 14 can have a length ranging from 5 μm to 100 μm (e.g., 20 μm), and a height-to-width ratio of 1:4 to 4:1 (or, in some embodiments, more than 4:1). Posts 14, for example, can have a size that is larger or smaller than, or matched to, the size or area of components 22. Additionally, posts 14 can have a shape (in cross-section) that is different than the shape of a contact surface of components 22 or a shape that corresponds to a shape of a contact surface of components 22. Stamp 10 can be provided on a support (not shown in the Figures for simplicity), for example glass, soda-lime glass, borosilicate glass, Pyrex, metal, ceramic, polymer, or a semiconductor (e.g., a wafer or portion of a wafer). The support can have a thickness ranging from 0.5 mm to 10 mm. These ranges and values are illustrative and not limiting and other materials and sizes are included in certain embodiments. Systems comprising motion platforms 40 for micro-transfer printing components 22 from a component source wafer 20 to a destination substrate 70 have been constructed and used to make a wide variety of applications, including, for example active-matrix color displays with pixel controllers and inorganic LEDs.

Components 22 can be at least partially coated with an ablative material 52 in an ablation layer 50. Ablative material 52 can absorb light 32 emitted from light source 30 and, in some embodiments, vaporizes (e.g., generates a plasma) that provides pressure pushing components 22 away from distal end 18 of selected posts 15 to detach (e.g., assist in detaching along with stamp 10 motion) components 22 from selected posts 15 (step 160). Not all of the ablative material 52 is necessarily removed when irradiated by light 32. Ablation layer 50 can be a patterned layer or an unpatterned layer and can be a layer of metal, a layer of dielectric material, a layer comprising a dye, a layer comprising a black material, or a layer comprising carbon black. In some embodiments, ablative material 52 is a dielectric, polymer, or resin and can comprise a dye or other light-absorbing material such as carbon black. Ablative material 52 can be coated, for example, spin coated, spray coated, or hopper coated, and, in some embodiments, patterned using photolithographic patterning methods. Ablative material 52 can be a photoresist material. The light-absorbing material can be matched to light 32 so that the light-absorbing material selectively and efficiently absorbs a frequency of light 32 emitted from light source 30. The frequency of light 32 emitted from light source 30 can generally be any electromagnetic radiation, such as, for example, visible light, ultra-violet light, or infra-red light. In some embodiments, ablative material 52 is substantially transparent to visible light, so that visible light emitted from component 22 can pass through ablation layer 50. In some embodiments, ablative material 52 absorbs visible light. In some embodiments, ablative material 52 is a metal, for example, gold, silver, or aluminum metal and can be part of a patterned circuit on a surface of components 22.

In some embodiments of the present invention, light 32 that irradiates selected posts 15 can irradiate distal ends 18 of selected posts 15 or can irradiate components 22 (e.g., portions of components 22 or one or more layers of or on components 22) or any combination of such elements. Light 32 absorbed by any one or both of the distal ends 18 of selected posts 15 and components 22, can heat one or both of the distal ends 18 of selected posts 15 and components 22. If the CTEs of various materials are different, when the materials are heated a shear force will be present between the materials with different CTEs as the different materials expand by different amounts. This shear force, if present between distal ends 18 of selected posts 15 and selected components 23 (e.g., portions of selected components 23) can cause (e.g., assist along with stamp 10 motion) selected components 23 to detach from distal ends 18 of selected posts 15. If only the distal ends 18 of selected posts 15 are heated by light 32, then expansion of the distal ends 18 can cause (e.g., assist along with stamp 10 motion) selected components 23 to detach from distal ends 18.

Destination substrate 70 can be any suitable substrate to which components 22 can be transferred (e.g., micro-transfer printed), for example glass, plastic, ceramic, sapphire, semiconductor, or quartz. Substrates found in the display industry are suitable and can be commercially obtained. Destination substrate 70 can have a layer 72 of adhesive provided on a surface of a substrate material, for example an epoxy, resin, adhesive, or polymer layer provided on a glass or plastic substrate material, for example SU-8. Adhesive layer 72 can assist in adhering components 22 transferred to destination substrate 70 and can be selected to facilitate adhesion given the material qualities and surface energies of components 22 and stamp 10. Adhesive layer 72 can be patterned (e.g., disposed only in desired locations corresponding to desired locations for components 22).

Exemplary micro-transfer printing methods for transferring active components 22 from one substrate to another are described in U.S. Pat. No. 8,889,485, entitled Methods of Surface Attachment of Flipped Active Components, issued Nov. 18, 2014. Micro-transfer printing processes suitable for disposing components 22 onto destination substrates 70 are described in Inorganic light-emitting diode displays using micro-transfer printing (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-Based Assembly, U.S. patent application Ser. No. 15/461,703 entitled Pressure Activated Electrical Interconnection by Micro-Transfer Printing, U.S. patent application Ser. No. 14/822,864 entitled Chiplets with Connection Posts, U.S. patent application Ser. No. 14/743,788 entitled Micro-Assembled LED Displays and Lighting Elements, and U.S. patent application Ser. No. 15/373,865, entitled Micro-Transfer Printable LED Component, the disclosure of each of which is incorporated herein by reference in its entirety.

According to various embodiments of the present invention, component source wafer 20 can be provided with components 22, release layer, and tethers already formed, or they can be constructed as part of a method in accordance with certain embodiments of the present invention. Component source wafer 20 and micro-transfer printable components 22, stamp 10, and destination substrate 70 can be made separately and at different times or in different temporal orders or locations and provided in various process states.

Methods disclosed herein can be iteratively applied to a single or multiple destination substrates 70. By repeatedly transferring sub-arrays of micro-transfer printable components 22 from a component source wafer 20 to a destination substrate 70 with a stamp 10 and relatively moving stamp 10 and destination substrate 70 between stamping operations by a distance equal to the spacing of selected micro-transfer printable components 22 in the transferred sub-array between each transfer of micro-transfer printable components 22, an array of micro-transfer printable components 22 formed at a high density on a component source wafer 20 can be transferred to a destination substrate 70 at a much lower density. In practice, component source wafer 20 is likely to be expensive, and forming micro-transfer printable components 22 with a high density on component source wafer 20 will reduce the cost of micro-transfer printable components 22, especially as compared to forming circuits on destination substrate 70. Transferring micro-transfer printable components 22 to a lower-density destination substrate 70 can be used, for example, if micro-transfer printable components 22 include components 22 that manage elements (e.g., are controllers) distributed over destination substrate 70, for example in a display, digital radiographic plate, or photovoltaic system. Moreover, in some embodiments, not every post 14 of a stamp 10 is contacted to a component 22 during a transfer printing operation.

In some embodiments, a component 22 is an active micro-transfer printable device that is an integrated circuit formed in a crystalline semiconductor material. The integrated circuit can comprise a substrate that provides sufficient cohesion, strength, and flexibility such that it can adhere to destination substrate 70 without breaking as transfer stamp 10 is removed.

In comparison to thin-film manufacturing methods, using densely populated component source wafers 20 and transferring functional micro-transfer printable components 22 to a destination substrate 70 that requires only a sparse array of micro-transfer printable components 22 located thereon does not waste or require active layer material on a destination substrate 70. Components 22 can be made with crystalline semiconductor materials that have higher performance than thin-film active circuits. Furthermore, the flatness, smoothness, chemical stability, and heat stability requirements for a destination substrate 70 used in some embodiments of the present invention may be reduced because the adhesion and transfer process is not substantially limited by the material properties of destination substrate 70. Manufacturing and material costs may be reduced because of high utilization rates of more expensive materials (e.g., component source wafer 20) and reduced material and processing requirements for destination substrate 70.

Certain embodiments of the present invention provide micro-transfer printed substrates populated with only known-good components 22 with improved yields and reduced manufacturing costs. For example, destination substrate 70 can be a display substrate and components 22 can be inorganic light-emitting diodes (LEDs) in a display made at least partly by micro-transfer printing. Ablation layer 50, when and where present, facilitates detaching selected components 23 from distal ends 18 of posts 14 of stamp 10; a substantially transparent ablation layer 50 enables light emitted from the inorganic light-emitting diodes to pass through the ablation layer 50, enabling a display that emits light in a direction away from the display substrate.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously.

Having described certain implementations of micro-transfer printing systems and methods of their use, it will now become apparent to one of skill in the art that other implementations incorporating the concepts of the disclosure may be used. Therefore, the disclosure should not be limited to certain implementations, but rather should be limited only by the spirit and scope of the following claims.

PARTS LIST

10 stamp
12 body
14 post
15 selected post
16 non-selected post
18 distal end of post
20 component source wafer
22 component
23 selected component
24 non-selected component
30 light source
32 light
34 optics
36 optical system
38 optics controller
39 memory
40 motion platform
50 ablation layer
52 ablative material
62 tether
63 fractured tether
64 anchor
66 patterned sacrificial layer
68 sacrificial portion
70 destination substrate
72 adhesive layer
74 first locations
76 second locations
82 semiconductor structure
83 component contact pads
84 electrode
87 patterned dielectric layer
88 encapsulation layer/second dielectric layer
90 test fixture
99 micro-transfer printing system
100 provide source wafer step
110 provide stamp with posts step
120 provide light source step
130 provide destination substrate step
140 test components to determine selected non-functional components step
141 test components to determine selected functional components step
150 contact stamp posts to component step
155 optional remove stamp from source wafer step
160 irradiate selected posts and detach selected components step
170 optional examine selected posts for selected components step
180 optional determine selected components remaining on selected posts step
190 print non-selected components to destination substrate step
191 move components to destination substrate step
195 select component subset step
200 remove stamp from destination substrate with no components step
201 remove stamp from destination substrate with non-selected components step
205 move stamp with respect to destination substrate step
210 clean stamp step
220 determine missing component test step
230 done step

What is claimed is:

1. A micro-transfer printing system, comprising:

a transfer stamp comprising a body and spaced-apart posts connected to and protruding away from the body, wherein each of the spaced-apart posts has a contact surface at a distal end away from the body, and the body and the spaced-apart posts each comprises a visco-elastic material capable of contacting components to temporarily adhere the components to the contact surfaces of the spaced-apart posts; and a light source operable to controllably irradiate the spaced-apart posts through the body with light to detach the components from the contact surface of the spaced-apart posts, wherein the body and the posts are substantially transparent to the light.

2. The micro-transfer printing system of claim 1, comprising an optical system comprising optics, wherein the optical system is operable to controllably direct light from the light source to the posts through the optics.

3. The micro-transfer printing system of claim 2, wherein each of the posts comprises a distal end away from the body and the optical system is operable to irradiate the distal end of one of the posts at a time.

4. The micro-transfer printing system of claim 2, wherein each of the posts comprises a distal end away from the body and the optical system is operable to irradiate a distal end of each of multiple ones of the posts at a time.

5. The micro-transfer printing system of claim 2, comprising a memory operable to store a mapping of selected components and non-selected components, wherein the optical system is operable to controllably direct light from the light source to the posts based, at least in part, on the mapping.

6. The micro-transfer printing system of claim 1, comprising a motion-control system operable to move the transfer stamp in at least two directions.

7. The micro-transfer printing system of claim 6, comprising an optical system comprising optics, wherein the motion-control system comprises a motion platform at least partially disposed between the optics and the body, and at least a portion of the motion platform is transparent to the light emitted from the light source.

8. The micro-transfer printing system of claim 6, comprising an optical system comprising optics, wherein the motion-control system comprises a motion platform and the optics are disposed between the motion platform and the body.

9. The micro-transfer printing system of claim 8, wherein at least a portion of the motion platform is transparent to the light emitted from the light source.

10. The micro-transfer printing system of claim 1, wherein the light source is a laser.

11. The micro-transfer printing system of claim 1, comprising a component source wafer comprising micro-transfer printable components, wherein the motion-control system is operable to controllably contact the posts to the components to adhere one of the components to each of the posts and remove the transfer stamp from the component source wafer with a component adhered to the distal end of each of the posts.

12. The micro-transfer printing system of claim 1, comprising a component adhered to each of the posts.

13. The micro-transfer printing system of claim 12, wherein the component comprises an ablation layer of ablative material that is in contact with the post to which the component is adhered.

14. The micro-transfer printing system of claim 13, wherein the ablation layer is a layer of metal, a layer of dielectric material, a layer comprising a dye, a layer comprising a black material, or a layer comprising carbon black.

15. The micro-transfer printing system of claim 13, wherein the light emitted by the light source is non-visible light and the ablation layer is at least partially transparent to visible light.

16. The micro-transfer printing system of claim 13, wherein the ablation layer is a patterned layer.

17. The micro-transfer printing system of claim 13, wherein the ablation layer is an unpatterned layer.

18. A micro-transfer printing system comprising:

a motion-control system comprising a motion platform having a transfer stamp attached or mounted thereto, wherein the transfer stamp comprises a body and spaced-apart posts connected to and protruding away from the body, wherein each of the spaced-apart posts having a contact surface at a distal end away from the body, the body and the spaced-apart posts each comprising a visco-elastic material capable of contacting components to temporarily adhere the components to the spaced-apart posts, and the motion-control system is operable to move the transfer stamp in at least two directions; and a light source operable to controllably irradiate the spaced-apart posts through the body with light to detach the components from the distal end of the spaced-apart posts when the transfer stamp is attached or mounted to the motion platform.

19. The micro-transfer printing system of claim 18, wherein the light source is a laser.

20. The micro-transfer printing system of claim 18, comprising an optical system comprising optics, wherein the optical system is operable to controllably direct light from the light source to the posts through the optics.

21. The micro-transfer printing system of claim 20, wherein each of the posts comprises a distal end away from the body and the optical system is operable to irradiate the distal end of one of the posts at a time.

22. The micro-transfer printing system of claim 20, wherein each of the posts of the transfer stamp comprises a distal end away from the body and the optical system is operable to irradiate a distal end of each of multiple ones of the posts at a time.

23. The micro-transfer printing system of claim 20, comprising a memory operable to store a mapping of selected components and non-selected components, wherein the optical system is operable to controllably direct light from the light source to the posts based, at least in part, on the mapping.

24. The micro-transfer printing system of claim 18, comprising an optical system comprising optics, wherein the motion platform is at least partially disposed between the optics and the body, and at least a portion of the motion platform is transparent to the light emitted from the light source.

25. The micro-transfer printing system of claim 18, comprising an optical system comprising optics, wherein the optics are disposed between the motion platform and the body.

26. The micro-transfer printing system of claim 25, wherein at least a portion of the motion platform is transparent to the light emitted from the light source.

* * * * *